United States Patent [19]
Driscoll

[11] Patent Number: 5,970,324
[45] Date of Patent: Oct. 19, 1999

[54] METHODS OF MAKING DUAL GATED POWER ELECTRONIC SWITCHING DEVICES

[76] Inventor: John Cuervo Driscoll, 7800 Netherlands Dr., Raleigh, N.C. 27606

[21] Appl. No.: 08/847,615

[22] Filed: Apr. 28, 1997

Related U.S. Application Data

[60] Continuation-in-part of application No. 08/831,518, Apr. 1, 1997, Pat. No. 5,852,381, which is a division of application No. 08/598,904, Feb. 9, 1996, Pat. No. 5,656,966, which is a continuation-in-part of application No. 08/207,717, Mar. 9, 1994, Pat. No. 5,592,118.

[51] Int. Cl.$^6$ .................................................. H01L 21/332
[52] U.S. Cl. ........................................... 438/134; 438/139
[58] Field of Search ..................... 438/133, 134, 438/139

[56] References Cited

U.S. PATENT DOCUMENTS

| | | |
|---|---|---|
| 3,739,235 | 6/1973 | Kessler, Jr. . |
| 3,798,079 | 3/1974 | Chu et al. .............................. 148/33.5 |
| 3,872,494 | 3/1975 | Davis, Jr. et al. ........................ 357/34 |
| 3,925,808 | 12/1975 | Rai-Choudhury .......................... 357/59 |
| 3,978,513 | 8/1976 | Terasawa . |
| 4,177,479 | 12/1979 | DeBruyne et al. . |
| 4,536,783 | 8/1985 | Miller et al. . |
| 5,223,442 | 6/1993 | Kitagawa et al. ............................ 437/6 |

FOREIGN PATENT DOCUMENTS

| | | |
|---|---|---|
| 0 046 578 A2 | 3/1982 | European Pat. Off. . |
| 31 20 254 A1 | 5/1982 | Germany . |
| 37 31 412 A1 | 5/1988 | Germany . |

OTHER PUBLICATIONS

Charles Belove, Handbook of Modern Electronics and Electrical Engineering, 1986, pp. 339–344.

Alex Polner, Characteristics of Ultra–High Power Transistors, 1975 (Abstract).

Primary Examiner—Brian Dutton
Attorney, Agent, or Firm—Burns, Doane, Swecker & Mathis, L.L.P.

[57] ABSTRACT

Methods for making semiconductor switching devices are disclosed. The switching device is designed and constructed to include, for example, a highly interdigitated cathode/gate structure on both sides of the chip. The semiconductor switching device can be four leaded which provides a great deal of flexibility in operation.

11 Claims, 16 Drawing Sheets

$\varepsilon_{OUT} < \varepsilon_{IN}$

*FIG. 5*
*(PRIOR ART)*
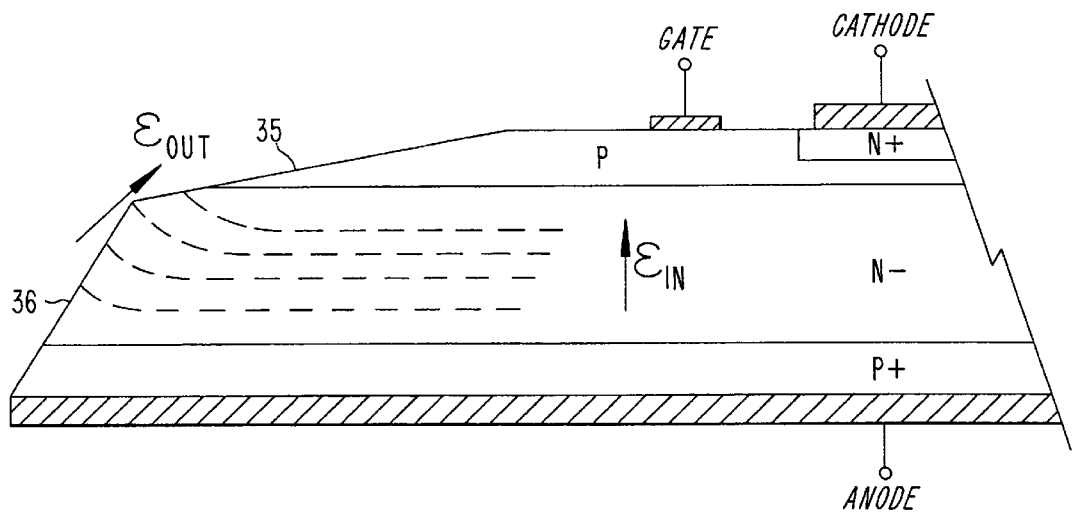
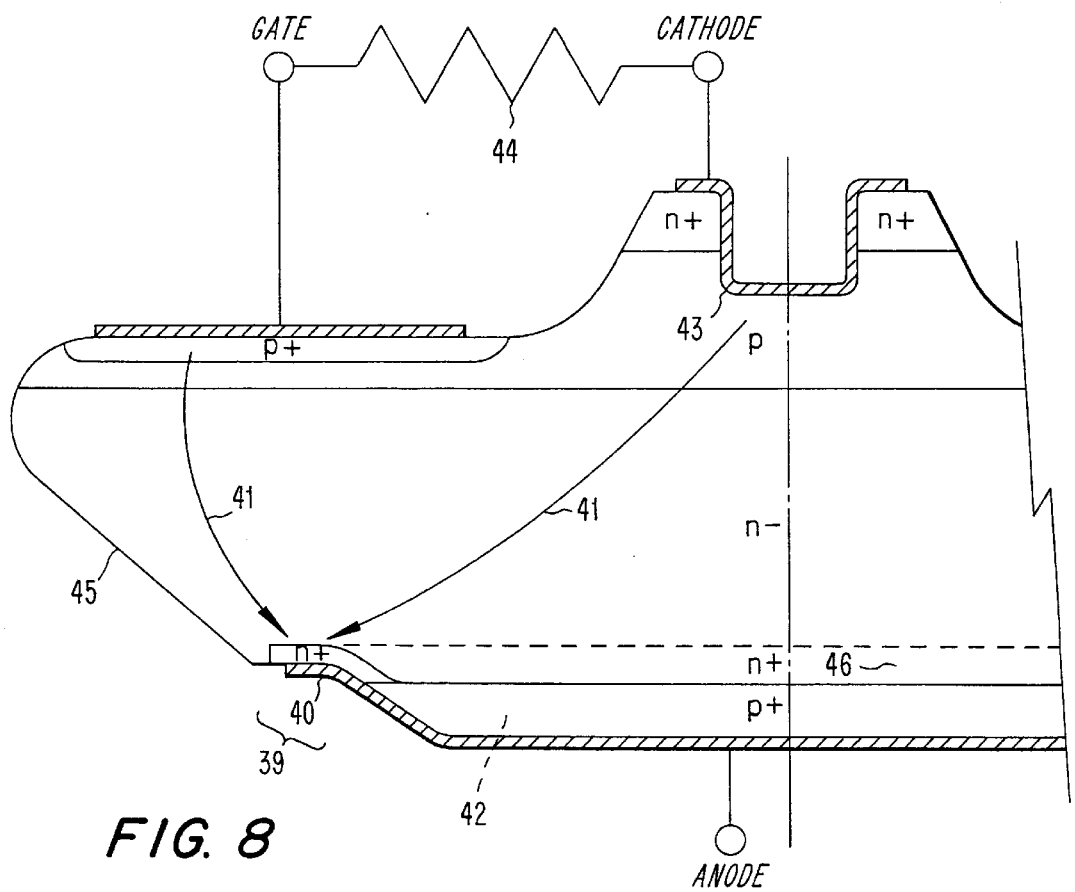
*FIG. 8*

METHODS OF MAKING DUAL GATED POWER ELECTRONIC SWITCHING DEVICES

RELATED APPLICATIONS

This application is a continuation-in-part of U.S. application Ser. No. 08/831,518 filed on Apr. 1, 1997 entitled "A Turbine Engine Ignition Exciter Circuit Including Low Voltage Lockout Control", now U.S. Pat. No. 5,852,581, which is in turn a divisional of U.S. application Ser. No. 08/598,904 filed on Feb. 9, 1996 entitled "A Turbine Engine Ignition Exciter Circuit", now U.S. Pat. No. 5,656,966, which is in turn a continuation-in-part of U.S. application Ser. No. 08/207,717 filed on Mar. 9, 1994 entitled "A Turbine Engine Ignition Exciter Circuit", now U.S. Pat. No. 5,592,118. The disclosures of all of these patent applications are expressly incorporated here by reference. This application is also related to U.S. patent application Ser. No. 08/847,614, entitled "Dual Gated Power Electronic Switching Devices", filed concurrently herewith.

BACKGROUND

The present invention relates generally to power circuits and systems and, more specifically, to power electronic switching devices.

Power electronic systems have many applications in today's technologies, such as motor drives and pulse power systems. As an example, consider the systems used to ignite turbine engines on aircraft, which systems are commonly referred to as exciters. Turbine engine ignition exciters have evolved considerably since their inception in the 1950's. First generation ignition exciters incorporated vacuum tube spark gap switching devices and vibrator type chopper, or DC-DC converter circuits. Given the severe operating environment of a turbine engine, i.e., high vibration, temperature extremes and widely varying input voltage and load impedance conditions, considerable effort was expended by the industry to develop highly reliable first generation components and circuit configurations.

Second generation ignition exciters were typically characterized by replacement of spark gap switching technology with a semiconductor switching device. These exciters commonly utilized three terminal (thyristor) switching devices to accomplish switching. This technology offered more precise spark timing and communication with an electronic engine control computer since feedback information could be effectively processed by the exciter charge pump (DC-DC converter) section. This provided a significant improvement over first generation devices, affording aviators considerably more control over the engine ignition process.

Conventional solid state ignition exciter circuits generally fall into one of two distinct categories. The first category being characterized by a series stack of switching devices to evenly distribute or divide the high (approximately 2–4 kV) tank capacitor voltage across each device. Such exciters incorporate elaborate voltage divider networks to protect and trigger the series ganged semiconductor switching devices from electrical imbalances generated during both the capacitor charge and discharge cycles. During the capacitor charge cycle, voltage must be evenly distributed across each device to prevent catastrophic failure of the entire series ganged semiconductor switching network. Likewise, during the discharge cycle, a series ganged back bias diode network is required to protect the switching devices from ring back which results during igniter plug firing. Circuits using this type of circuitry require careful screening and matching of thyristor leakage current and similar characteristics to ensure proper operation at elevated ambient temperatures. Moreover, this technology is electrically inefficient since the combined losses of several individual switching elements (during turn on and on-state) are very high.

By contrast, a second current circuit design philosophy incorporates a single thyristor switching device operated at a comparatively lower (0.4–1 kV) tank voltage. This approach offers considerably higher efficiency than the first design philosophy since only a single (VI) loss is incurred rather than multiple losses experienced with the aforementioned series ganged approach. However, this benefit is quickly offset since the tank capacitor voltage must be significantly lower than the series ganged approach to avoid using "hockey puck" type switching devices. While "hockey puck" type switches would offer adequate voltage ratings, their considerable bulk, weight and limited di/dt capability preclude their use in pulse discharge type circuitry. Therefore, current designs tend to utilize roughly 1,500 volt rated (phase control type) thyristors with correspondingly lower tank voltage.

To date, both types of solid state semiconductor switch exciter circuits have incorporated off-the-shelf, commercially available, phase control type thyristors. These devices, while readily available in commercial markets, are designed primarily for 60 Hz power control applications. Consequently, the dv/dt and di/dt ratings of these devices is limited with respect to requirements of a pulse power discharge application. The following summary provides a background of various thyristor technologies conventionally available for switch exciter circuits, as well as other power electronic applications.

Phase-Control Thyristors are designed to maximize the silicon for use as active emitter area at 60 Hz AC. The devices have large, shorted emitters (for high dv/dt) with single-point center gates, and depend on the relatively slow plasma spreading to turn on emitter areas remote from the point center gate. Researchers have extensively examined the spreading velocity by viewing radiative recombination of the plasma. Despite comprehensive research, spreading resistance of conventional devices necessitates low (e.g., less than 200 A/$\mu$S) di/dt performance.

Inverter Thyristors have distributed or interdigitated gates (for high di/dt), similar to transistor emitter patterns, to turn on and utilize larger initial areas of the emitter for faster turn-on. For faster turn-off, heavy gold or platinum diffusion and/or electron radiation reduce carrier lifetime, thereby reducing thyristor turn-off times (tq). Unlike transistors, inverter thyristors have heavily shorted emitters to prevent latch-up when dv/dt is being applied. These inverter design features allow thyristors to be used at high (up to 10 kHz) repetition rates, but at the expense of high forward voltage drop. High forward drop severely limits performance of these devices in turbine ignition applications since increased (VI) power loss accelerates onset of thermal runaway, limiting upper temperature performance.

Gate Assist (GATO) and Gate Turn-Off (GTO) Thyristors have npn regions which are designed like high-speed transistors, where the gate (or base) is used for charge-control functions. In GATO closing switches, the gate is used to extract charge from the gate emitter junction during the tq and dv/dt switching interval. This allows high rep-rate performance without the adverse on-state voltage trade-off of lifetime-controlled inverter SCR's. The disadvantage of GATO's is the requirement for negative gate bias and current during the off-state and commutation interval, which considerably increases the complexity of exciter (thyristor) triggering circuitry. Gate Turn-Off Thyristors (GTO's) are similar to GATO's but must be lifetime controlled to act as opening switches. GTO's are made with both symmetric and asymmetric structures. Asymmetric GTO's are made both with and without anode shorts. The best turn-off gains for GTO's are obtained with shorted anode, asymmetric structures. So far, some of the highest di/dt pulse power closing switches have been GTO-type structures. These GTO emitter structures are ideally suited to receive and distribute high turn-on gating currents. If opening is not required, the highest possible hole-electron lifetimes will lead to the lowest possible on-state voltage. Therefore, GATO is perhaps the best conventional semiconductor switch structure for pulse-power applications such as turbine engine ignition systems.

MOS-Controlled Thyristors (MCT's) are integrated arrays of paralleled GTO cells (on the order of 20 micron spacing), with complementary FET's connected from anode to gate and gate to cathode. All of the cells have turn-off FET's that act as gate cathode shunts during turnoff and during the off-state. Some of the MCT cells have turn-on FET's connected from anode to gate. For those turn-on cells having their own anode-gate FET, the upper-base spreading resistance under the emitter is low, and good gate emitter injection is assured for good di/dt. However, not all cells have turn-on FET's and area utilization (60%) is not as good as with GATO's (>85%), precluding use of devices in volumetric/weight sensitive aviation turbine engine applications. Furthermore, MCT gate-yield considerations limit the active area to about 1 cm². High-current high-voltage applications are therefore better served by GATO-type designs, even though the turn-off function is not required.

As can be seen from the foregoing, thyristors have not yet been optimized to serve as both closing and opening switches for "square" reverse bias safe operating area (RBSOA) performance, i.e., turn-off to full current and voltage without snubbers. As a result designers have sought circuit solutions such as forced commutation for turn-off, resonant topologies (soft switching for low RBSOA switches), saturable reactors to limit di/dt, snubbers to limit reapplied dV/dt, and expensive gate drives to accommodate GTOs with low turn off gain and long turnoff "tail currents" due to open base recovery of the wide base pnp. The MCT has addressed many of these difficulties but also suffers from open base recovery (low RBSOA), is difficult to scale up to large areas with good yield, has a low active to total area ratio and a relatively small number of turn-on cells. Moreover, turn-on FETs associated with MCTs must block the full device voltage and must be sized based on the relationship blocking voltage to the 2.5 power, i.e., (blocking voltage)$^{2.5}$.

Thus, it would be desirable to provide the industry with power electronic switching devices which can serve as both closing and opening switches at unlimited di/dt's and without snubbers or saturable reactors.

SUMMARY

Accordingly, it is an object of the present invention to provide an alternative to conventional power electronic devices which alternative has increased operational flexibility and improved operational characteristics. The present invention achieves these objects in the novel dual gated MOS-controlled thyristors (DMCT) and dual gate turn-off thyristors (DGTO) described in detail below.

Semiconductor switching devices according to the present invention are constructed to be capable of nearly unlimited di/dt by virtue of, for example, simultaneous electron-hole injection, reduced spreading resistance under the emitter and a continuous and narrow solder bumped gate/cathode structure. High di/dt has many desirable ramifications in power applications, such as the turbine ignition exciter application described above. For example, by offering extremely high di/dt, at elevated temperature, while reliably blocking nominal 2–5 kV tank voltage, the PPT allows solid state exciters to utilize bona fide high voltage, e.g., greater than 10 kV, PFN's.

It is a further object of the present invention to offer semiconductor devices having improved ambient temperature performance. Existing thyristor junction temperatures ($T_j$) are limited to approximately 125° C. By utilizing novel thyristor processing technology according to exemplary embodiments of the present invention, asymmetric semiconductor structure and edge-bevel area gain reduction techniques such as positive beveling and electron beam irradiation, significantly higher junction temperatures on the order of, for example, 175° C. can be achieved. By maximizing junction temperature capability, the probability of thermal runaway is minimized.

It is still a further object of the present invention to provide a four leaded semiconductor device having an anode, anode gate, cathode and cathode gate. By selectively connecting the anode and anode gate leads and/or the cathode and cathode gate leads, (or by opening the emitter leads) semiconductor switching devices according to the present invention can be operated or transitioned in a number of different modes. For example, the DGTO can transition from a pnpn transistor to a pin diode, operate as a semiconductor controlled switch (SCS), operate as a reversibly triggered/conducting thyristor, operate as an anode gated GTO, operate as a cathode gated GTO, operate as an anode/cathode gated SCR or operate as an MCT that is controlled from both anode and cathode sides.

Inner and outer gates of continuous cathode designs according to the present invention can be used as a symmetric source and drains of an n-channel JFET, with the solder-bumped serpentine used as a gate, and with the anode and anode gate open. Both the npn and pnp portions of the DGTO can be used as efficient bipolar junction transistors.

Access to all four thyristor layers allows much better device control, higher hole/electron lifetimes and results in better turn-off performance because open base recovery with the attendant hole/electron recombination "tail" of the wide base pnp and npn is avoided. With contacts to all four layers and a narrow and continuous emitter, the conducting pnpn structure can transition to a recovering (reverse biased) pin diode by connecting both gates to their respective emitters. Thus, the external circuit will sweep charge from the relatively large area control junction, rather than depending on open base hole-electron recombination as in convention IGBTs, MCTs and three-leaded GTOs. Open base recovery is associated with low RBSOA, the need for snubbers, high on-state and turn-off dissipation, low rep rate and low controllable current density, all of which are avoided by the present invention.

BRIEF DESCRIPTION OF THE DRAWINGS

The foregoing, and other, objects, features and advantages of the present invention will be more readily understood upon reading the following detailed description in conjunction with the drawings in which:

FIG. 5 illustrates a conventional hockey puck thyristor edge beveling technique;

FIG. 8 provides a cross-sectional illustration of asymmetric and integral back bias edge shorting geometries enabling anode and cathode shorting of symmetric or asymmetric structures according to an exemplary embodiment of the present invention;

DETAILED DESCRIPTION

Figure 1A:
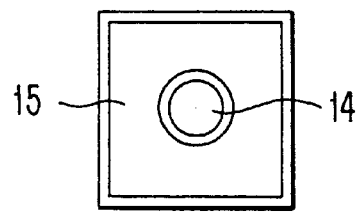
FIGS. 1A–1B compare cathode/gate metalization area of a standard 1.5 kV phase control thyristor with a continuous emitter associated with exemplary switching devices according to the present invention.
Figure 1B:
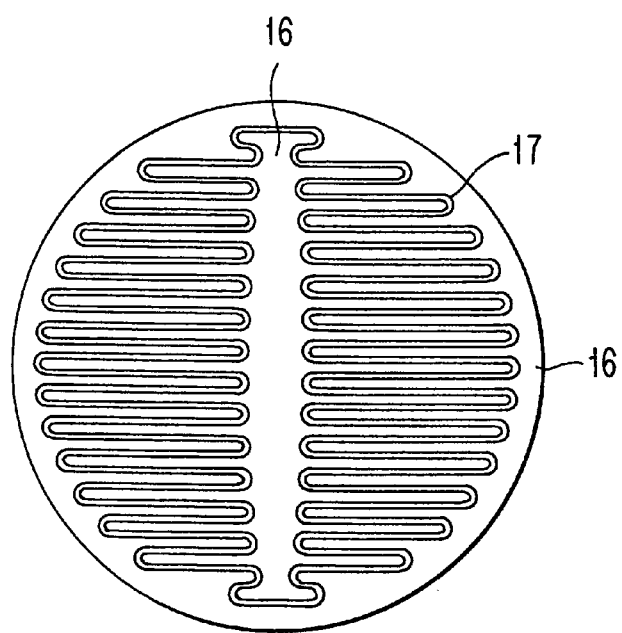

FIGS. 1A and 1B illustrate exemplary differences in structure between traditional phase control thyristor structures and the novel DGTO device. It will be noted that conventional phase control devices, generically illustrated in FIG. 1A, have silicon structures which limit blocking voltage to <1.5 kV and also have essentially point contact gate regions 14 surrounded by the cathode region 15. Conversely, devices according to exemplary embodiments of the present invention (exemplified in FIG. 1B) utilize interdigitated gate/cathode geometries 16 and 17. Note the relatively long gate/cathode periphery in FIG. 1B as compared with that of FIG. 1A. Interdigitation of the gate 16 and cathode 17 structures provides several important advantages relative to pulse discharge (di/dt) conduction. For example, when the device is triggered, gate charge is immediately distributed over the entire emitter, thus eliminating plasma spreading time delay. Likewise, long and ballasted emitter structure 17 more efficiently collects current during conduction, thereby eliminating excess current density at "hot" spots during high di/dt periods. Hence, this extremely compact device, e.g., 1 in.×1 in.×⅛ in., high voltage, e.g., 5 kV, high current, e.g., >1.2 kA, is well suited for the high rise time, di/dt waveforms associated with pulse power applications, e.g., turbine engine ignition exciters, motor drivers and Pulse Power Switches.

Figure 1C:
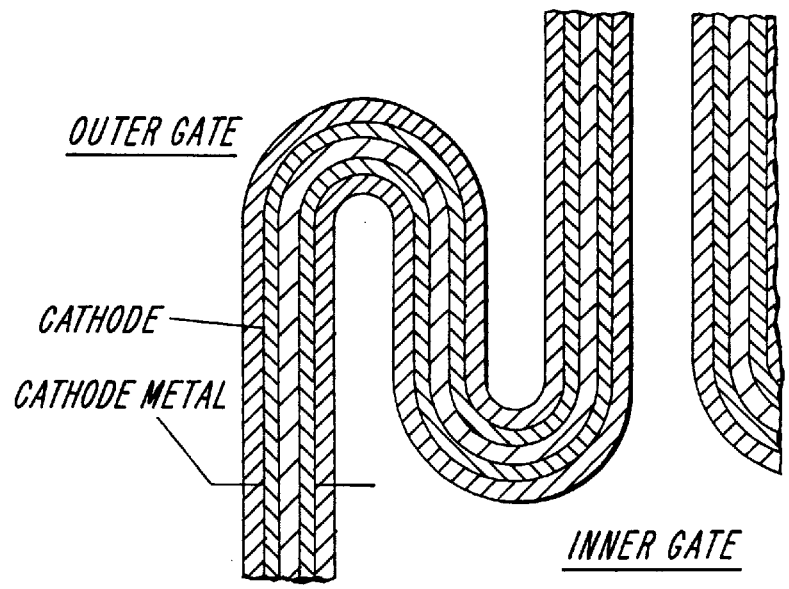
FIG. 1C is a detailed plan view of a portion of the emitter of FIG. 1B.

FIG. 1C illustrates in more detail a portion of the serpentine emitter shown in FIG. 1B wherein the various metal layers can be seen.

Figure 1D:
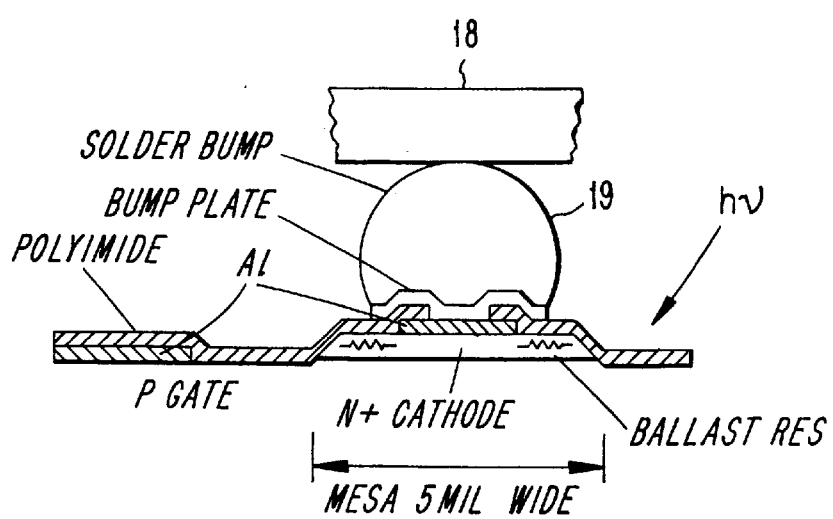
FIG. 1D is a cross-sectional view of the solder bumped emitter of FIG. 1C.

Therein the continuous and narrow (e.g., 5 mil.) serpentine emitter is accessed everywhere and on both sides by the inner and outer gate metal by virtue of a continuous solder bar/bump (FIG. 1D). Cathode current can be extracted vertically from the entire length via a solid emitter metal plate 18 soldered to solder bumps 19. Holes (not shown) are provided in the solid emitter plate through which the inner and outer gates can be accessed. Accordingly, an insulating layer of polyimide or DuPont Pyralux covers the gate metal everywhere except where gate and emitter contact windows are opened.

Figure 2:
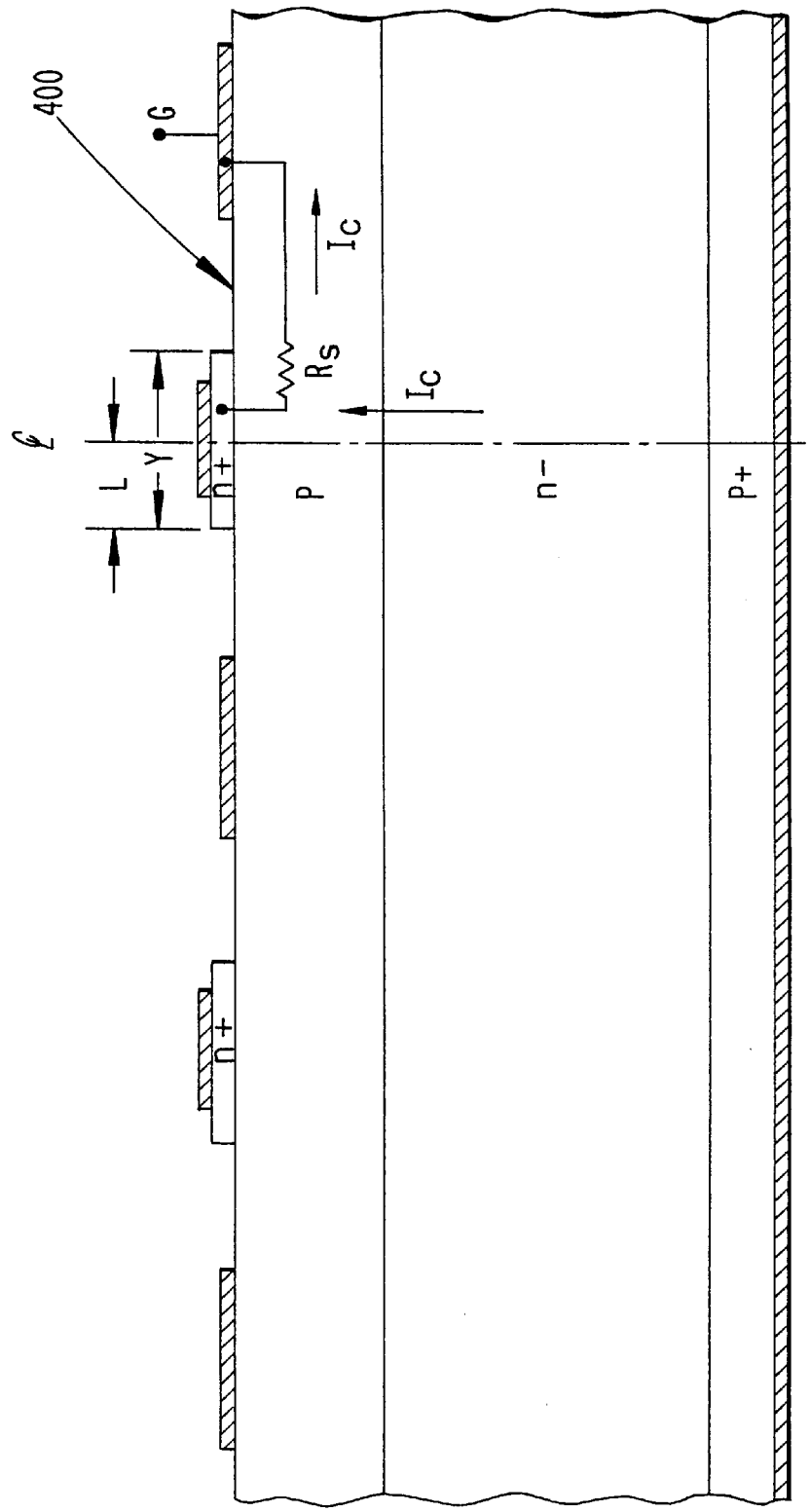
FIG. 2 illustrates a one-sided emitter/base region geometric relationship, which allows immediate conduction of high (di/dt) current following a gate trigger pulse or photon pulse.

Referring to FIG. 2, unlike conventional thyristors, the emitter and gate geometries are such that the emitter center line is everywhere equidistant from the gate region, and less than a single diffusion length L from the gating region 400. The emitter region width Y is maintained at, for example, less than or equal to about 1 to 5 times the gate (P base) region which, in this example, means that the emitter width Y is less than or equal to 0.005 inches. This ensures maximum use of the entire emitter area during initial triggering and turn-off. That is, during application of a gate trigger pulse, the entire emitter region is activated preventing concentration of charge in proximity of the gate connection G which occurs in conventional point contact thyristor designs, i.e., gate 14 in FIG. 1A. This feature allows the entire device to modulate and conduct full anode current coincidental with the application of a (gate) trigger pulse or a photon trigger pulse. Note that, controllable current Ic times spreading resistance Rs is below 0.6 V for turn off in this exemplary embodiment.

Figure 3:
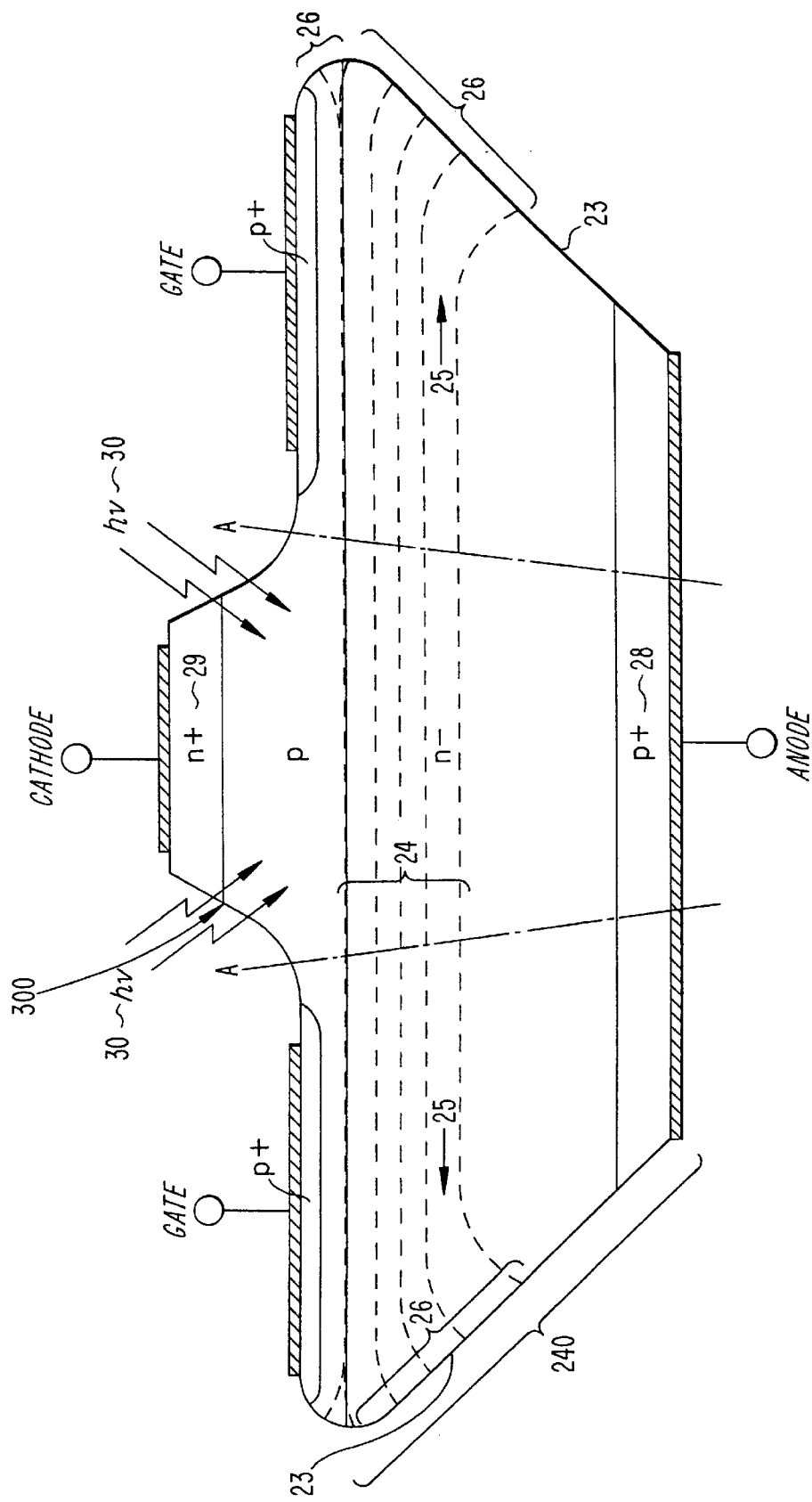
FIG. 3 is a cross-sectional diagram illustrating an edge bevel region where peak field is minimized on both sides of the junction.

FIG. 3 illustrates a structure according to a first exemplary embodiment of the present invention. By positively beveling the die at edge 23 so as to "spread out" electric field lines on both sides of the high voltage junction when the device is forward biased, rather than the traditional negative bevels (which tend to concentrate E field lines under a forward bias) utilized by most hockey puck type phase control devices, a number of advantages are realized. For example, this unique positive beveling ensures bulk field breakdown since the surface electric field is spread out over a longer distance 26 than the bulk electric field 24, thereby promoting maximum theoretical (bulk) breakdown. To further reduce leakage current, all edge regions 27 outside of lines AA can be treated with electron radiation, further reducing pnp gain and associated leakage current. This unique design enables small, high voltage chips in small packages.

At the edge of the chip, a unique pnp structure 240 is created by etching off the outer n+ region. Note that accordingly the N+ (cathode) region is not embedded in p-doped material nor p+ in n-doped material. Since the (equivalent) npn and pnp transistor has been eliminated from the outermost regions, edge leakage current involves only the np structure as seen, for example, if FIG. 8. Additional etching, to the n-region, further reduces edge leakage to np diode levels by avoiding both npn and pnp gains, see also FIG. 8. Since leakage current in the vicinity of the bevel edge area 23 is higher than in other areas, design according to this exemplary embodiment ensures that this surface leakage current will not be amplified by npn/pnp thyristor or transistor action.

The emitter n+p junction and pn-regions 300 can also be made light sensitive by etching close to the pn-depletion regions. Triggering photons generate hole-electron pairs within these depletion regions effectively shorting the blocking junction and resulting in simultaneous injection from both p+ and n+ emitting regions 28 and 29. The device can thus be made sensitive to light radiation 30 by a unique etch which is pervasive over the entire gate-emitter length on both sides of the chip (see, e.g., FIG. 7) and provides exposure of n+p junction 300. This allows optional optoelectronic triggering as an alternative to current triggering via the gates. The gate-emitter length is relatively great and base spreading resistance low as compared to standard phase control thyristors because the serpentine length to area ratio (aspect ratio) is high, this being possible due to the unique cathode soldering techniques described herein. Due to considerably higher isolation achieved with optoelectronic coupling, exciter circuitry and "up stream" supply electronics are further protected from thyristor failure modes and effects.

Figure 4A:
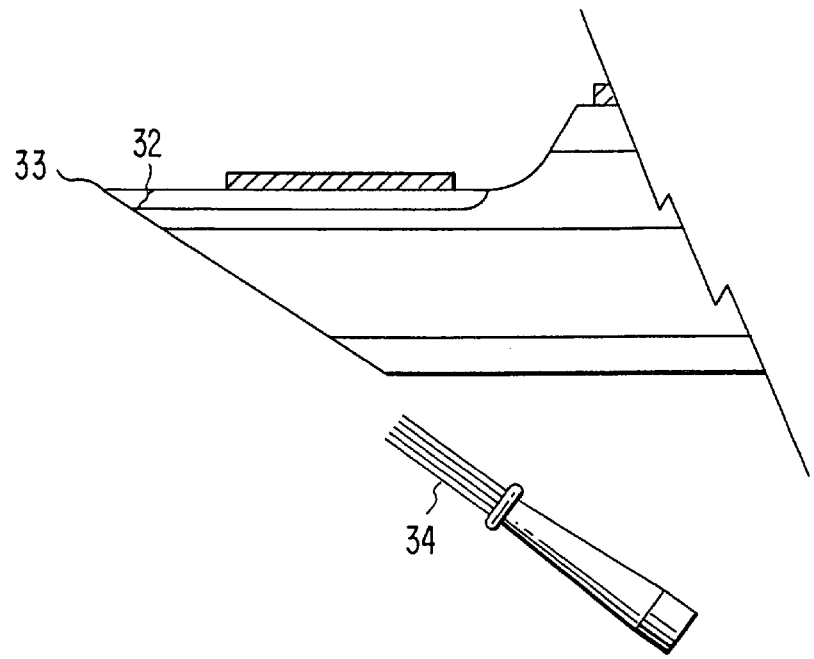
FIGS. 4A–4B illustrate different edge bevel (sand blasting) techniques and methods according to exemplary embodiments of the present invention.
Figure 4B:
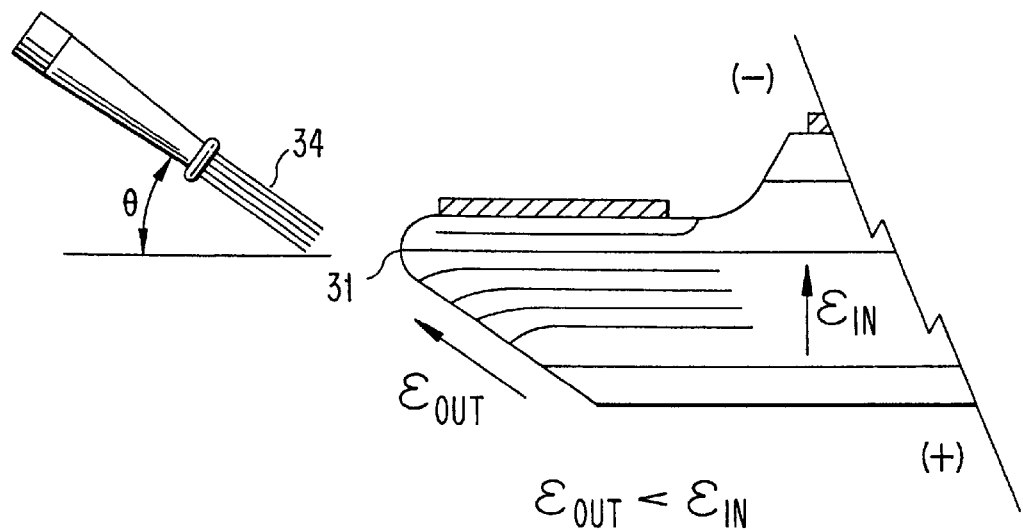

Referring to FIGS. 4A and 4B, edge beveling techniques according to the present invention are illustrated. The rounded region 31 of FIG. 4B is desirable since cracks and fractures 32 of FIG. 4A caused during processing and handling are minimized by elimination of sharp edge 33. Cracks and chips contribute significantly to, and can cause failure of, semiconductors since high leakage current and low breakdown voltage result therefrom. FIG. 4A illustrates a sand blast method of die edge beveling wherein sand 34 is blasted from the bottom of chip (die) toward the top. FIG. 4B illustrates a second method of forming the bevel where the sharp edges 33 are replaced by rounded edges 31. By changing the direction of the sand blast, or by square cutting the die using a saw, a blunt edge, less prone to cracking is created. The sand blast profile 34 shown in FIG. 4B eliminates sharp edges since the distribution of the profile is such that some of the sand contacts the edge to round it off. The sand blast can be directed against the substrate at an angle ⊖ having a range of from, for example, 0–45 degrees inclusive.

FIG. 5, by contrast, illustrates the conventional bevels for large, e.g., ≈3 kV hockey puck type thyristors. Current thyristor structures use a double bevel angle, one negative 35, and one positive 36. Negative (Vbo) bevel 35 tends to concentrate E field lines when the device is forward biased (anode positive WRT cathode; forward blocking condition). This promotes dielectric breakdown at device surface rather than through (bulk) Si. Conversely, phase control devices (which typically must block voltage reliably bi-directionally (60 Hz sinusoid)) require a second "positive" bevel to protect the device during reverse (Prv) bias condition. That is, when sinusoidal stress reversed polarity occurs, positive bevel 36 (which would normally tend to spread (surface) E field concentration) actually concentrates the field near the interface with negative bevel 35, thereby protecting the device from same bulk breakdown phenomenon.

In contrast, a dual positive bevel 23 (FIG. 4B) using sand blast and etching allows the device to realize (bulk) Si breakdown equal to theoretical Si breakdown. In comparison, traditional hockey puck devices, such as that illustrated in FIG. 5, can only achieve, for example, 80% of theoretical (bulk Si) breakdown voltage and must utilize considerably more Si and wafer "real estate".

These conventional devices have blocking voltages on the order of 3 kV and require 2×0.2" or about 10 mm (linear, over entire dimeteral surface) of Si be used for beveling. The novel beveling methods described above in conjunction with FIG. 4B according to the present invention require only about 2×0.032", or 1.6 mm Si for the bevel area for a greater than 5 kV device. This feature provides economic fabrication of devices with diameters on the order of, for example, about 4–25 mm, which are capable of reliably blocking, for example, 2 to 6 kV. In contrast, existing MCT's require about 30% of the non-active chip area for passivation.

Figure 6A:
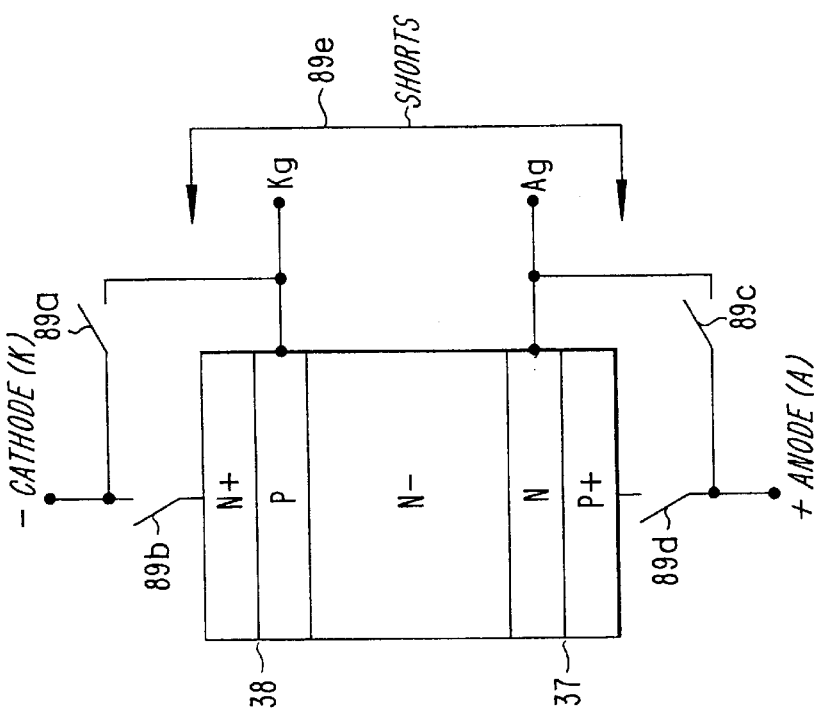
FIG. 6A is a schematic representation used to illustrate device variations/transitions according to exemplary embodiments of the present invention.

Referring to FIG. 6A, a DGTO according to another exemplary embodiment having four leads, i.e., cathode (K), anode (A), cathode gate (Kg) and anode gate (Ag) leads is illustrated. If both emitting injectors 37 and 38 of the thyristor structure are shorted, the device blocks voltage like a diode. That is, by effectively shorting the p+n 37 and n+p 38 injecting junctions of the thyristor, npn and pnp gains are eliminated thereby reducing leakage current levels to those associated with diode structures and permitting high temperature ($T_j \geqq 175°$ C.) operation. Selective shorting of the injecting junctions, and other selective connections, is accomplished by the provision of switches 89a–89d in the lead connections. The switches can, for example, be implemented as transistors fabricated within the DGTO itself or externally thereto. For example, if switches 89a and 89c are open and switches 89b and 89d are closed, the device is in its thyristor mode. If switches 89a and 89c are closed and switches 89b and 89d are open, the device is in its PIN diode mode. Transitions among these modes can be effected by switches 89a to e in any combination.

Figure 6B:
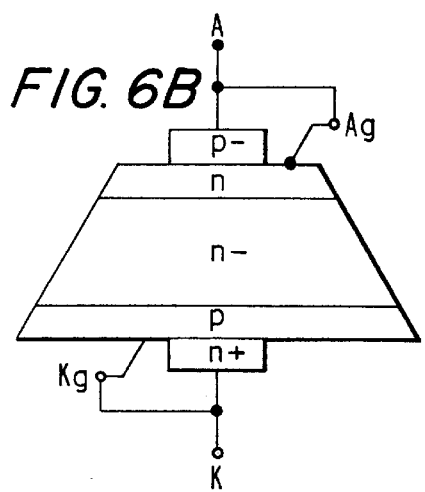
FIG. 6B illustrates an exemplary configuration for the four leaded DGTO of FIG. 6A wherein the DGTO operates as a PIN diode.

FIGS. 6B–6G illustrate other exemplary ways in which a four leaded PPT according to this exemplary embodiment of the present invention can be connected. For the first time, exemplary transitions between these modes can be effected by appropriate connections of the DGTO leads. For example, if the anode gate is connected to the anode and the cathode gate is connected to the cathode, then the DGTO device transitions from thyristor to PIN diode mode (FIG. 6B). In this way, the DGTO can dynamically transition from operating as a conducting thyristor to operating as a reversed biased and clearing PIN diode, thus serving as a current interrupter having the best reverse biased safe operating area (RBSOA) known.

Figure 6C:
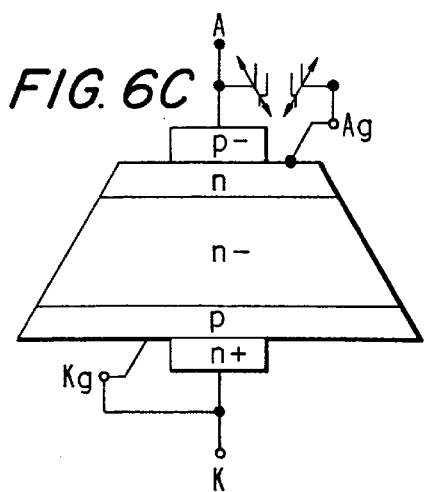
FIG. 6C illustrates a second exemplary configuration for the four leaded DGTO of FIG. 6A wherein the device operates as a silicon controlled switch.

A silicon controlled switch (SCS) is one in which the voltage between the anode and the anode gate is variable, which results in a device which breaks over at an adjustable voltage, e.g., a relaxation oscillator. This exemplary configuration is illustrated in FIG. 6C. Thus, a new category of vertically versus horizontally conducting SCS switches capable of high current and high voltage, unlike existing planar SCS switches which are limited to low current/low voltage operation.

Figure 6D:
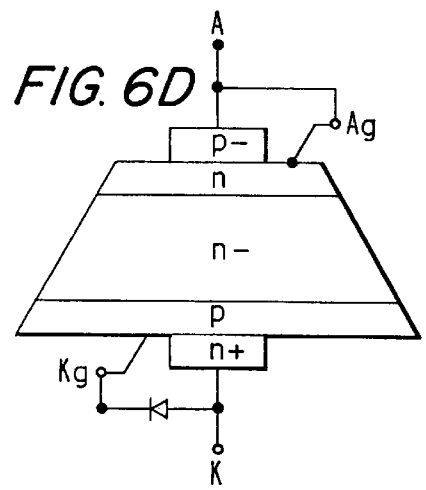
FIG. 6D illustrates a third exemplary configuration for the four leaded DGTO of FIG. 6A wherein the device operates as a reversibly triggered/conducting thyristor.

FIG. 6D illustrates the novel four leaded DGTO connected to operate as a reversibly triggered/conducting thyristor. In this device, current will flow through the cathode to the cathode gate (through a diode inserted into the connection and bypass the cathode emitter and out the anode gate or shorted anode.) Reverse conducting will eliminate the need for a separate inverse parallel diode in many applications as well as keep the device reliably turned-on when current undergoes multiple reversals, e.g., in exciter circuitry.

Figure 6E:
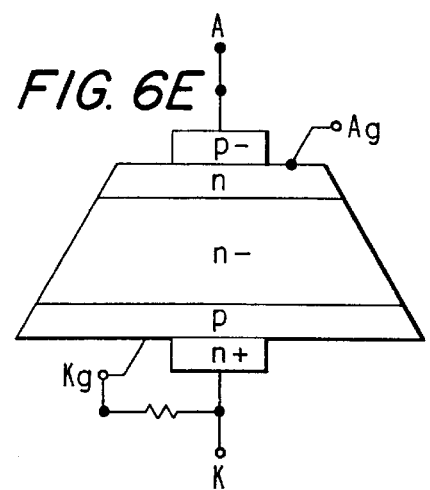
FIG. 6E illustrates a fourth exemplary configuration for the four leaded DGTO of FIG. 6A wherein the device operates as an anode gated GTO.

An anode gated GTO can be created by configuring the four leaded DGTO in the manner illustrated in FIG. 6E. Since conventional semiconductor devices do not provide anode gate leads, this type of device has no counterpart among semiconductor devices. However, the anode gated GTO will perform in a manner superior to that of conventional cathode gated GTOs by virtue of its higher turn-off gain and better ballasted nn-base.

Figure 6F:
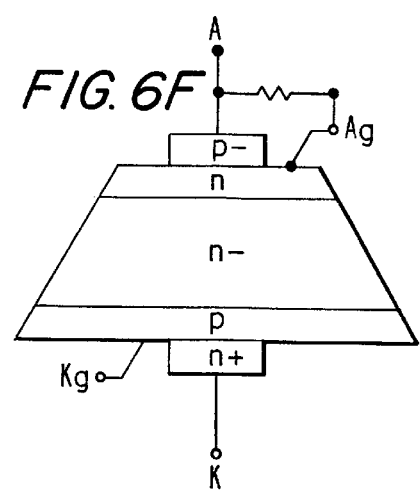
FIG. 6F illustrates a fifth exemplary configuration for the four leaded DGTO of FIG. 6A wherein the device operates as a cathode gated GTO.

A cathode gated GTO can be created by configuring the four leaded PPT as shown in FIG. 6F. While cathode gated GTOs per se are known, these conventional devices do not include anode gate leads, i.e., conventionally the anode and anode gate are separated by a junction without the possibility of introducing a discrete resistance therebetween. As seen in FIG. 6F, however, cathode gated DGTOs according to the present invention can include a discrete resistor R since electrically separated leads are available for the anode and anode gate. By varying the value of R, users of cathode gated DGTOs which are created by configuring the device as shown in FIG. 6F can adjust the performance of the device between maximum on-state and maximum off-state performance.

Figure 6G:
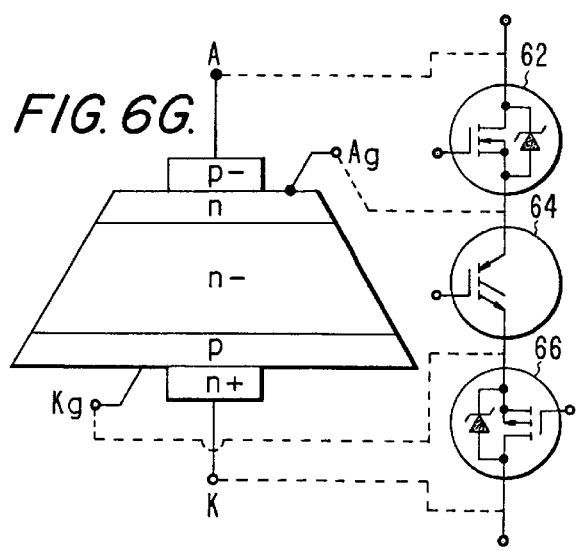
FIG. 6G illustrates a sixth exemplary configuration for the four leaded DGTO of FIG. 6A wherein the device operates as a four leaded gate voltage controlled GTO or DMCT.
Figure 9:
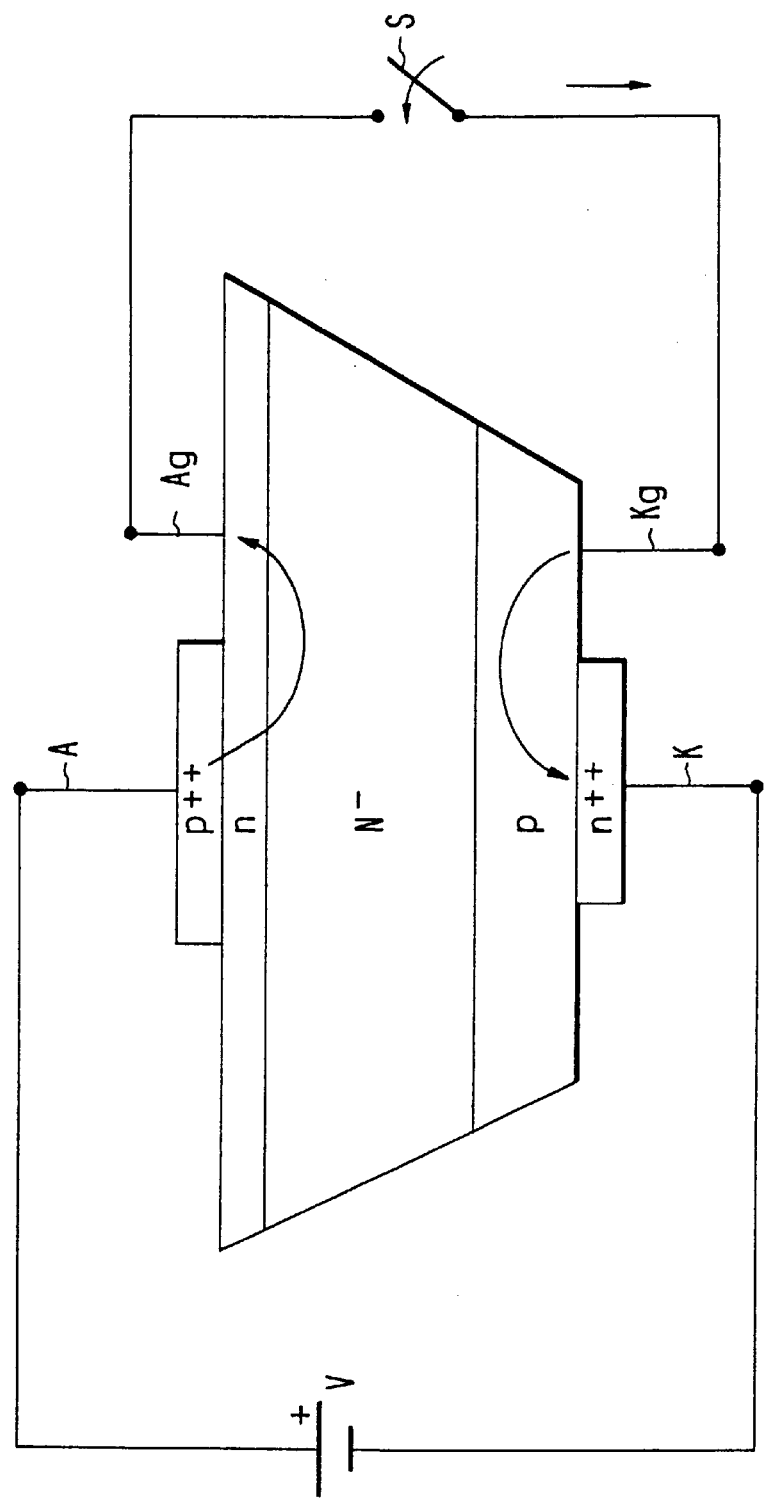
FIG. 9 is a pictorial representation of a four leaded DGTO according to the present invention wherein both emitters can be turned on with a single switch.
Figure 16:
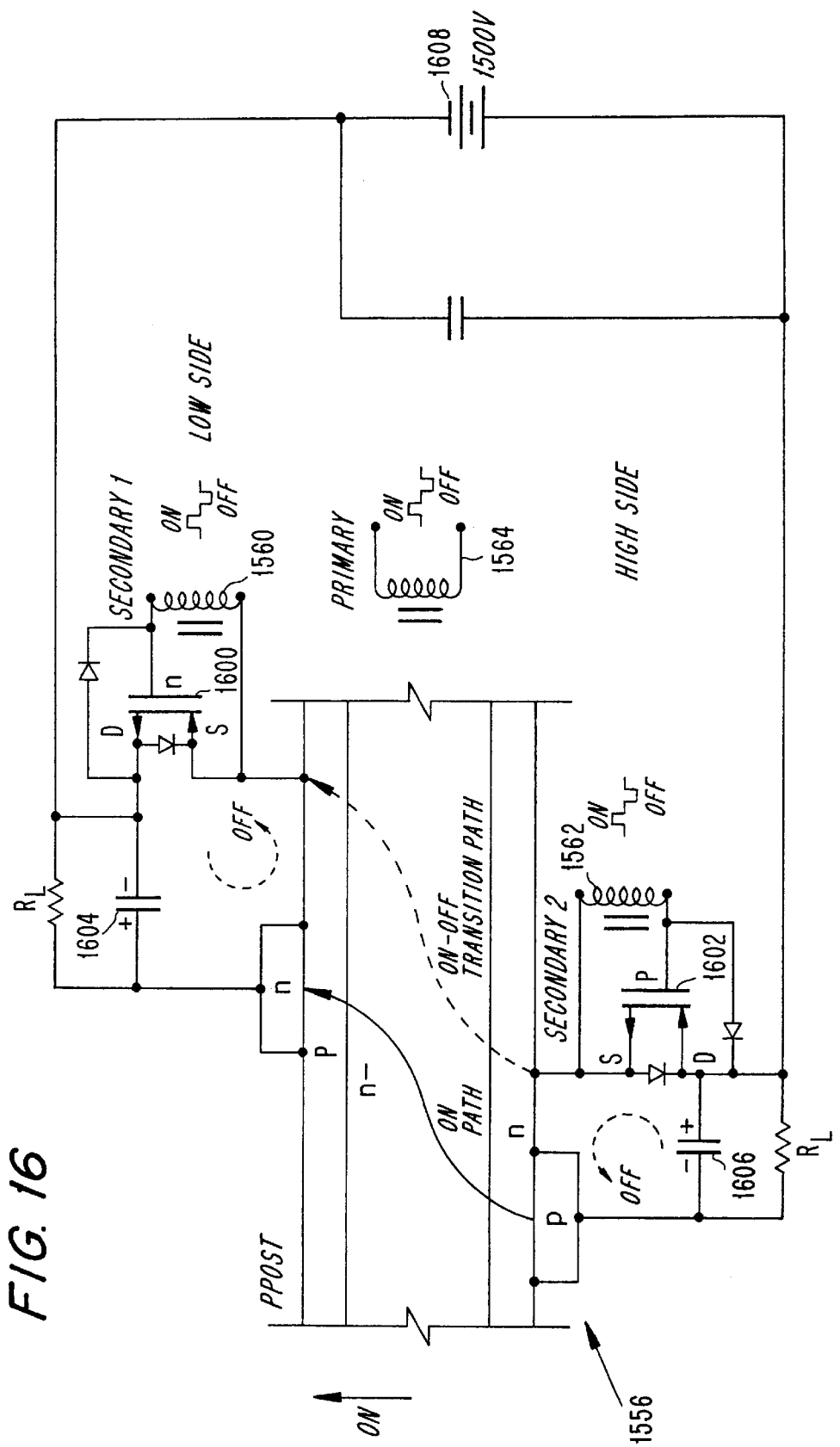
FIG. 16 illustrates an application of a four leaded DGTO device operating as a five leaded DMCT.

FIG. 6G illustrates the four leaded DGTO configured as a DMCT. Specifically, a DMOS FET is connected between each of the anode and anode gate, and the cathode and cathode gate. An IGBT 64 interfaces these two circuits. FIG. 9 (described below) illustrates the turn-on action served by IGBT 64. FIG. 16 illustrates the turn-off action served by the two DMOS FETS 62, as well as the advantages of being able to refer the FETS 62 to the low side of both loads (i.e., to reverse bias and clear both emitter junctions prior to recovery of the internal pin diode).

Figure 7:
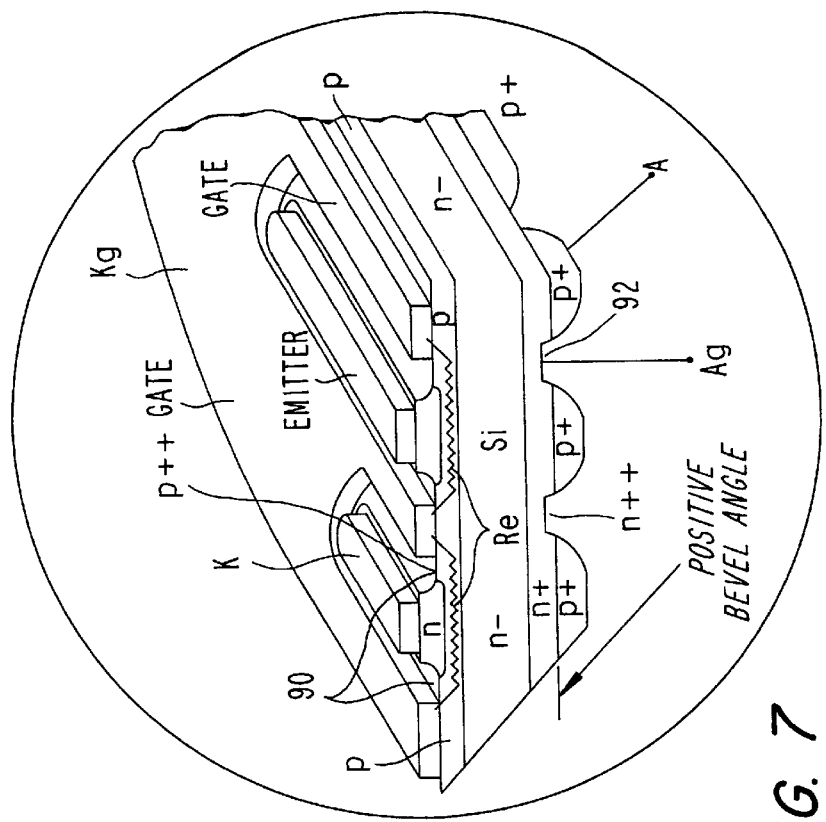
FIG. 7 is an isometric rendering of a DMCT processed on both sides of an asymmetric pn+n–pn+wafer.

To achieve a four leaded DGTO including an anode gate, devices according to this exemplary embodiment are processed on both sides of the wafer. FIG. 7 provides an isometric rendering of a DGTO processed on both sides of an asymmetric pn+n−pn+ wafer which, in conjunction with FIG. 8, also illustrates the emitter shorting technique. Both the cathode and anode emitters have been etch defined and metalized in a manner that allows gating on both sides of the pellet using the above-described solder bump technique. This double sided gating capability provides the following operational advantages:

Better turn-on performance by enabling forward injection (gating) of electrons and holes from both cathode and anode emitters (injectors) simultaneously.

Better off-state performance at high temperature (125 to 250° C.) by shorting both anode and cathode gates to their respective emitters. Leakage current is forced to bypass the injecting junctions for diode-like blocking performance.

Better turn-off performance is achieved by forcing on-state current to bypass both anode and cathode injecting junctions (FIG. 6A) via gate-injector shorts, 89*a* and 89*c*, and/or emitter switch opens, 89*b* and 89*d*, or by the reverse bias of one or both injecting junctions (FIG. 16) to ensure quench of transistor action. The DGTO will then turn off and recover like a diode to full rated current and voltage without snubbers (i.e., "square RBSOA").

Cathode gate contact is accomplished by an etch down, e.g., at regions 90 and 92 of FIG. 7. One method of providing anode gate contact, similar to the technique used for the cathode side, involves building etched "holes" 92 in the anode p+ region which penetrate to adjacent n+ material. These processes permit effective shorting of the cathode and/or anode emitters at low level (blocking current levels) such as those experienced during the energy storage device charge cycle, yet permits high current triggering and conduction at high conduction levels, such as those experienced during exciter discharge. Effective low level shorting and high level triggering is illustrated in the novel double sided etch down structure illustrated in FIG. 7.

FIG. 8 illustrates a method and structure according to an exemplary embodiment of the present invention for shorting both anode and cathode regions of both symmetric and asymmetric structures to achieve high blocking temperature capability and/or intrinsic inverse parallel diode. Anode shorting reduces leakage current associated with npn gain and imperfect passivation of the bevel area. Leakage current contributes considerably to power losses and high junction temperature while blocking voltages. Likewise, since leakage current increases with temperature, exciter top-end operational temperature performance is limited. At high temperatures, thyristor leakage causes die (chip) heating which, if unchecked, will continue until catastrophic thermal runaway occurs. Anode shorting for either asymmetric or symmetric structures is accomplished by removing (either by grit blast or etch method, for example) the outer region 39 of the (P+) anode.

This procedure provides at least two significant advantages. First, a shorting metal such as Au—As 40 can be alloyed into the n-region making an efficient inverse diode 41. Second, by limiting application of anode metal to the outer periphery etch region, defined by zone 39, an efficient blocking diode structure is created at the outer periphery of the pnpn device. Thus, eliminating npn and pnp gain at the beveled surface (i.e., low leakage current), and providing reverse blocking voltage capability (asymmetric or symmetric case). Cathode shorting can be accomplished by introducing internal shorts 43 over the entire emitter area or by providing external resistors 44 connected between cathode and gate terminals. This feature eliminates a problem associated with high temperature pnpn thyristor blocking voltage, i.e. pnpn leakage current is highest in vicinity of bevel area 45. Accordingly, FIG. 8 illustrates how the outer bevel area can be modified to eliminate pnp and npn gain due to leakage current along surface of bevel for both symmetric and asymmetric thyristor structures. It will be appreciated by those familiar with semiconductor processing, that an asymmetric thyristor device would contain an additional n+ layer 46, allowing good ohmic contact using Al or similar metalization, as well as a lower on-state voltage and fast turn-on times.

FIG. 9 illustrates a technique for turning on both emitters in four leaded DGTOs according to the present invention using a single switch S, e.g., an SCR, a high voltage IGBT or another DGTO, e.g., a light-triggerable thyristor. The function served by switch S can also be served by direct photon triggering, thereby effectively shorting the blocking junction and enabling double injection from both emitters. Switch S can be provided on the same wafer as the DGTO or may be provided as an external component. By applying a voltage V across the anode and cathode as shown in FIG. 9, simultaneous injection from both the p+ and n+ emitter junctions occurs when switch S closes or shorts 89e are applied (FIG. 6A). High di/dt performance is realized by the simultaneous turn-on of both npn and pnp transistors along the peripheries of both the cathode and anode serpentine emitters, followed thereafter by pnpn latch on. For turn-off in resonant circuit topologies, reverse ring thru current effectively clears both injecting junctions via switch S to turn off the DGTO very quickly. This stands in stark contrast to conventional thyristors, MCTs and IGBTs which require lifetime killing via electron radiation or gold or platinum diffusion to provide a low $T_q$ (turn-off time). Lifetime killing has the associated disadvantage that the turn-on voltage for a given device is significantly higher than it would be absent e.g., electron radiation. For example, 3.5 kV devices made according to the present invention might have an on-state voltage on the order of 1.5 volts at about 800 A/cm$^2$ while conventional, electron radiated devices, such as IGBTs, would need on the order of 3 volts to provide the same turn-off time.

Figure 10:
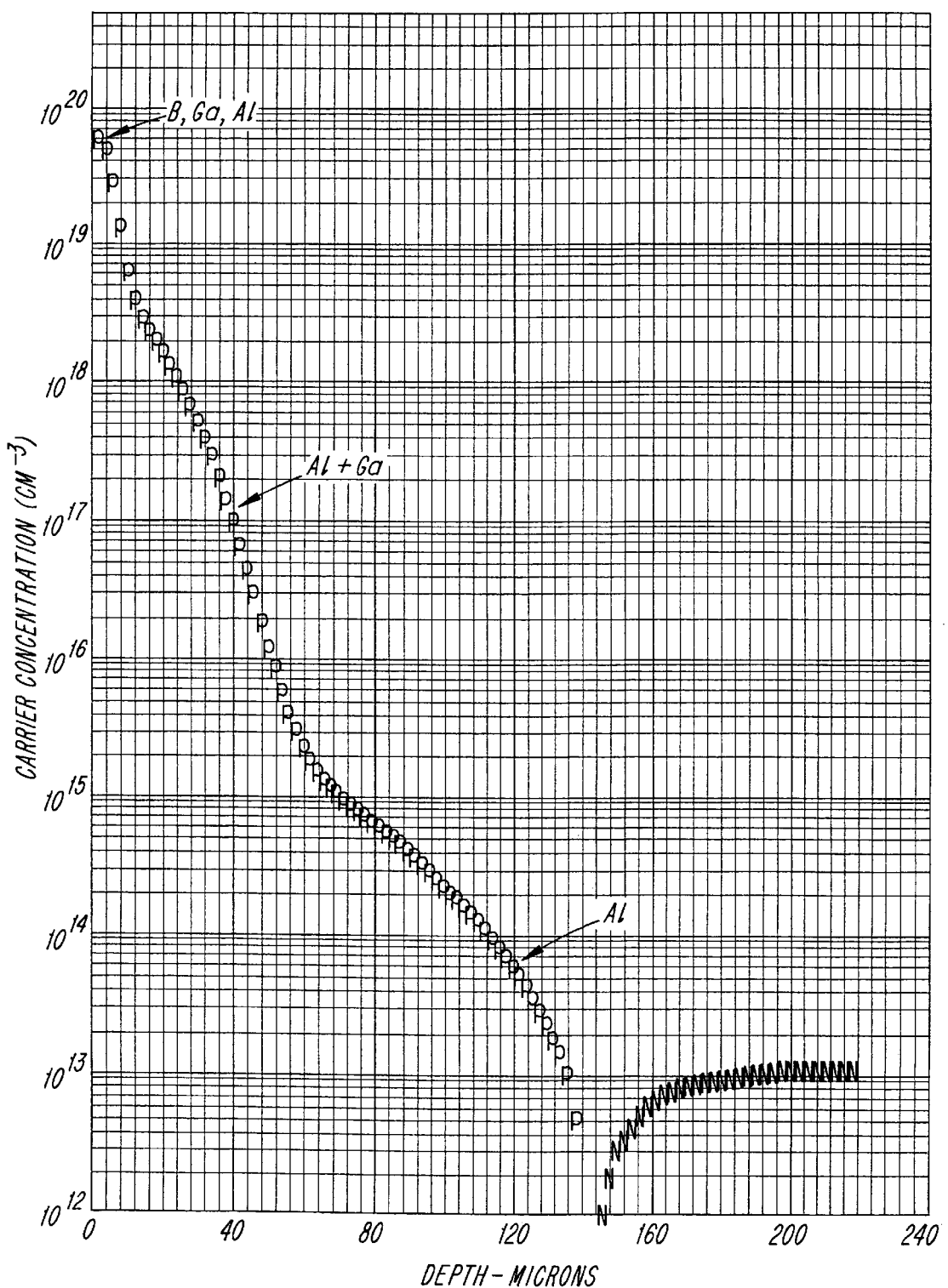
FIG. 10 graphically depicts an exemplary (anode) P region carrier following ion implantation and diffusion of Al, Ga and B.

Having described various exemplary structures for DGTO/DMCT semiconductor devices according to the present invention, the focus now turns to exemplary techniques for fabricating such devices. FIGS. 10–14 illustrate an exemplary manufacturing technique for a single-sided DGTO according to the present invention that can also be helpful to both sides. Therein, the devices are currently at the metalizing step. FIG. 10 illustrates the p region resulting from a diffusion of Al, Ga and B into both sides of a 37 mil thick Float Zoned Si wafer which was NTD (Nutron Transutated Doped) to approximately 1.5 E13 (cm$^3$). The novel diffusion technique involves ion implanting and driving Al, Ga and B into the wafer with an approximately 16 hour 1275° C. diffusion cycle. To prevent device contamination, and associated excess leakage current, the Si is "capped" with layers of SiO$_2$—Si$_3$—N$_4$—SiO$_2$ thus preventing entrance of contaminants and out diffusion. The capping/oxide layer materials and order of application were developed to provide a complete "cocoon" around the Si wafer, preventing entrance of contaminants or out diffusion.

Likewise, the oxide layers have been optimized to prevent cracking of the capping layer. It will be appreciated that the invention utilizes an ion implantation technique whereby Al, Ga and B are ion implanted through the oxide layer. Al is used to achieve a deep (approximately 4 mil) junction for high voltage capability, with a reasonable (approximately 16 hour 1275° C.) diffusion. Due to the poor (approximately 4%) electrical affectivity of Al, Ga and B are introduced to increase concentration of active electrical acceptors for good ohmic contact and injection efficiency. By way of contrast, conventional technology requires very long, high temperature diffusions, for example, about 135 hours at 1275° C., which are consequently prone to contamination from impurities, e.g. Na, which diffuses through (quartz) diffusion tubes increasing leakage current. HCL is used to tie up the Na ions.

To expand on this three element doping procedure, Al is used since it is a fast diffusing (P type) dopant which will dope an Si lattice properly with 16 hr. 1250° C. diffusion, as opposed to traditional B 135 hr. 1275° C. diffusion. Al is a good fit in the Si crystal, yielding low crystal stress. Unfortunately, Al tends to bond with oxides creating oxide complexes lowering the effective doping to roughly 4%. Ga is used next to achieve higher doping concentration. Since Ga does not tend to form oxide complexes, it is a more efficient dopant. Again, diffusion time is short. Finally, B is used as a getter to "lift" impurities to the surface where they can be removed (etched off). Boron also provides improved ohmic contact. Ion implantation through oxide layer prevents out-diffusion and prevents contamination by, for example, Na, which would reduce carrier lifetime and increase leakage current through space charge generation in the depletion layer.

Figure 11:
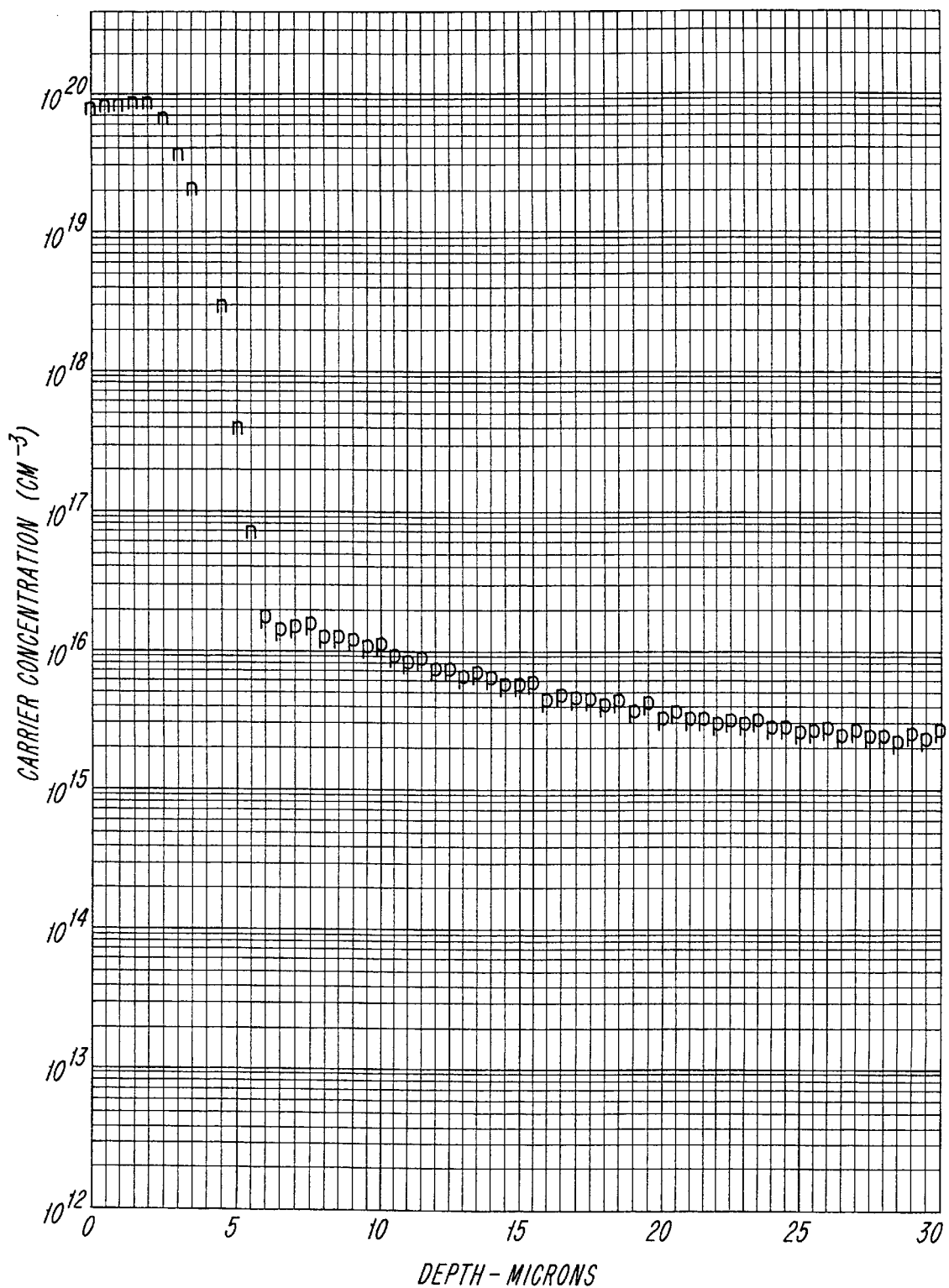
FIG. 11 illustrates an exemplary cathode carrier concentration for devices according to exemplary embodiments of the present invention.
Figure 12:
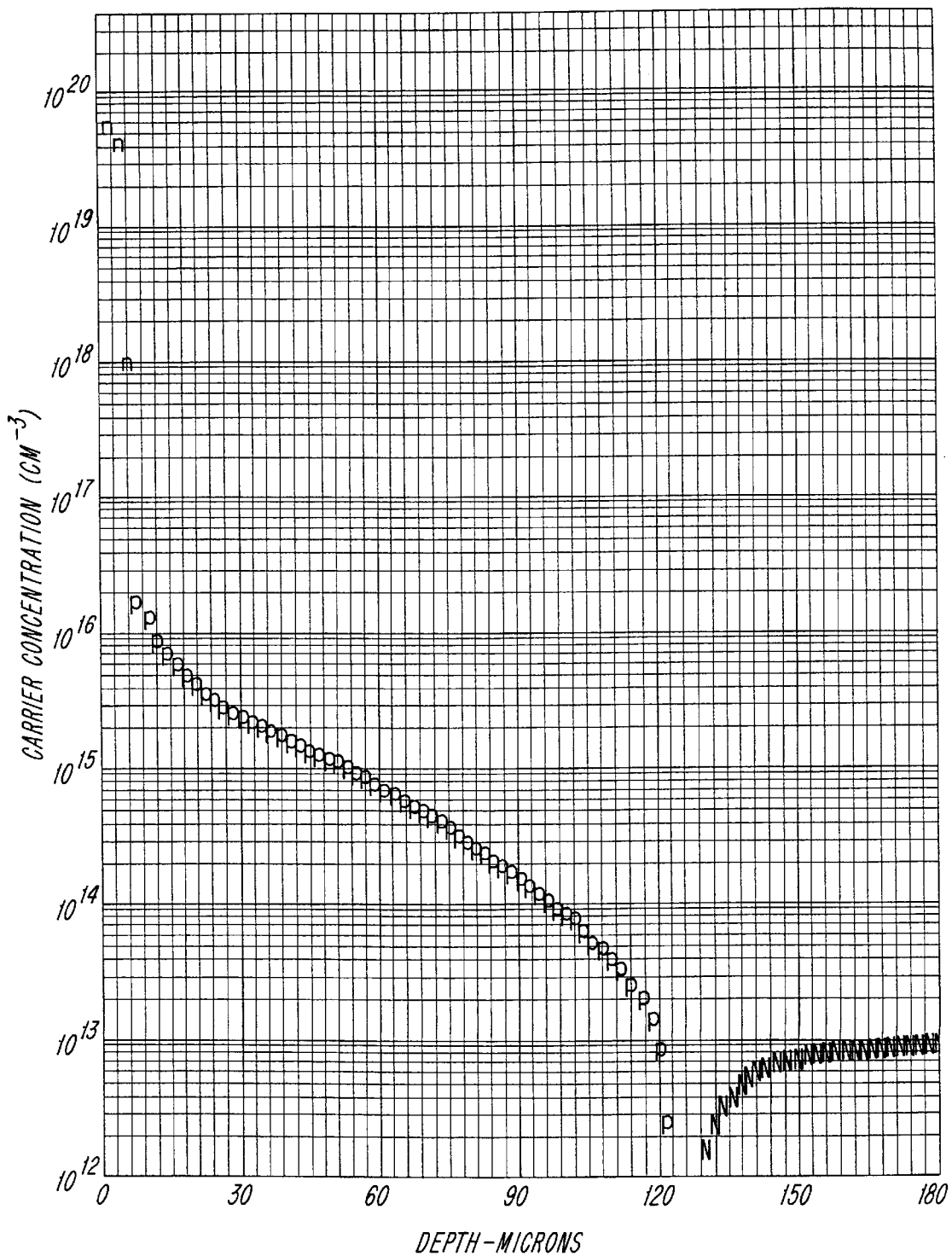
FIG. 12 is a continuation of the cathode carrier concentration profile of FIG. 11.

Exemplary embodiments of the present invention can perform diffusion using, for example, either resistive heaters or microwave oven heating. The microwave technique can be implemented, for example, by replacing a standard fixed frequency magnetron with a variable frequency variable frequency TWT (Traveling Wave Tube). This technique is favored since the TWT allows uniform RF heating of the Si, without heating the surrounding environment, thereby significantly reducing probability of contamination. This is a considerable advancement over current diffusion oven techniques since diffusion temperature can now approach Si melting temperature. Diffusion oven techniques are notably limited since quartz holding tubes used during the diffusion process are prone to sagging and devitrification at temperatures above 1200° C. The resulting pnp structure is then one side lapped to a p concentration on the order of 10E17. The wafer is then diffused with phosphorous, on both sides, to a depth of about, for example, 6.5 microns to form a npnpn structure. The anode n side is then removed forming the raw blanket npnp wafer. FIGS. 10–12 illustrate the complete profile which is capable of blocking, for example, >5 kV.

Figure 13:
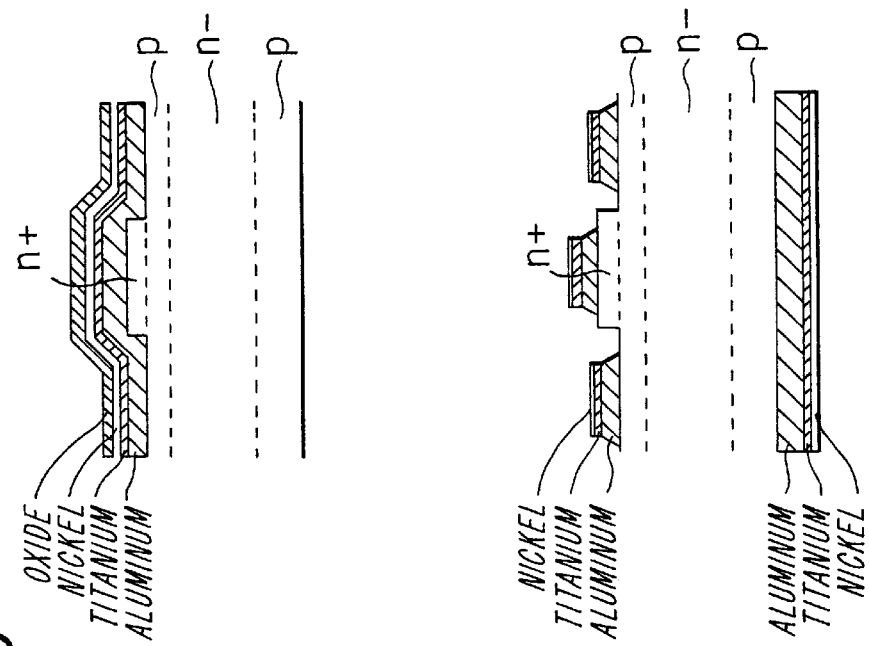
FIG. 13 provides a summary of an exemplary manufacturing process according to the present invention.
Figure 13:
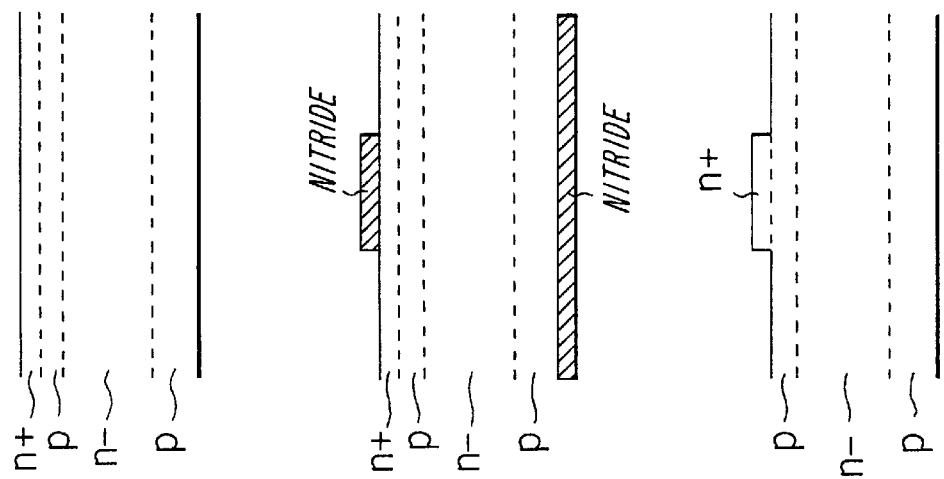

FIG. 13 illustrates an exemplary method of forming the Si surface, i.e., defining the emitter, through the metalization process. The starting Si substrate is made by the sequential diffusion of Al, Ga and B into a, for example, 450 Ohm-cm, 37 mil NTD doped n– wafer thereby forming a pnp. One side of the wafer is lapped, etched and n+ phosphorus (POCL3) is predeposited on both sides and annealed to form a n+ pnp n+ wafer. The emitter mask is used to selectively remove n+ from the cathode side of the wafer and the blanket n+ from the anode side to achieve the n+pn–p+ structure.

FIG. 13 depicts a process that enables construction of a high voltage type device that replaces planar diffusion fabrication methods, thus eliminating carrier lifetime reducing oxide mask/etch processes. That is, this process allows the thyristor to be etched, defined and metalized without any carrier lifetime reducing process steps, translating into lower on-state (forward conduction) voltage. Although the FIG. 13 process depicts only one sided processing, double-sided exemplary embodiments of the present invention can be realized by applying the teachings of FIG. 13 to both sides of the wafer in conjunction with other packaging related steps described below.

First, a low pressure chemical vapor deposited (LPCVD) nitride is deposited and patterned through use of standard photolithography masking techniques. The etch process described in FIG. 13 can be accomplished by utilizing the selective etch process depicted in FIG. 14, and results in an emitter step height on the order of, for example, about 7.5 microns. The N+ etch down procedure illustrated in FIG. 14 renders the P base region fully exposed. This significantly increases optoelectronic qualities of device, while also improving carrier lifetime. Since the N+ etch is a unique, selective etch, N+ material is removed, exposing underlying P material. This provides excellent uniformity and control which in turn allow the fine geometries and uniform electrical performance. The oxide layer used in fabrication of standard devices reduces carrier lifetime, increasing on-state (forward conduction) voltage. Also shown in FIG. 14 is the increase in sheet resistance as the NP junction is approached.

Figure 14:
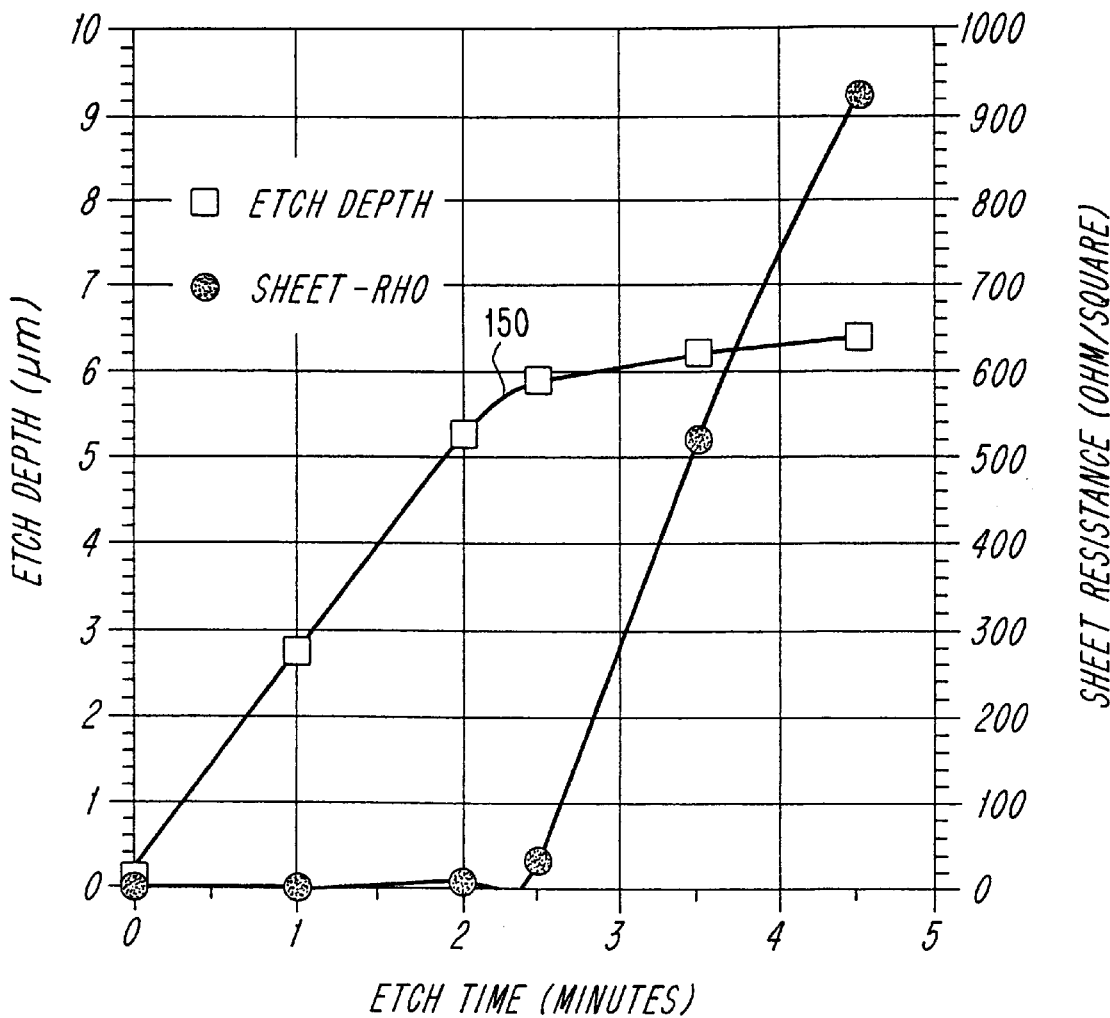
FIG. 14 illustrates (in sheet rho versus etch time) an exemplary process used to form the emitter structure according to exemplary embodiments of the present invention.

FIG. 14 involves a non-selective Si etch that removes the remaining n material to allow reliable contact to the p gate region; followed by the removal of the nitride mask. FIG. 13 involves the metalization process which is also used to alloy dope the gate regions for good ohmic contacts to the lightly doped gate regions. Al, Ti, and Ni are evaporated and sputtered onto the emitter side and etch separated to obtain the gate-emitter lateral diode. Step 20 involves anode metalization using blanket Al—Ti—Ni. A result achieved using this process is to obtain good ohmic contacts to both lightly doped p Si (the gate region), the heavily doped P anode and the n+ cathode. Good on-state voltage is then achieved by alloying the Al into the Si with 500° C. sinter step 21.

Figure 15:
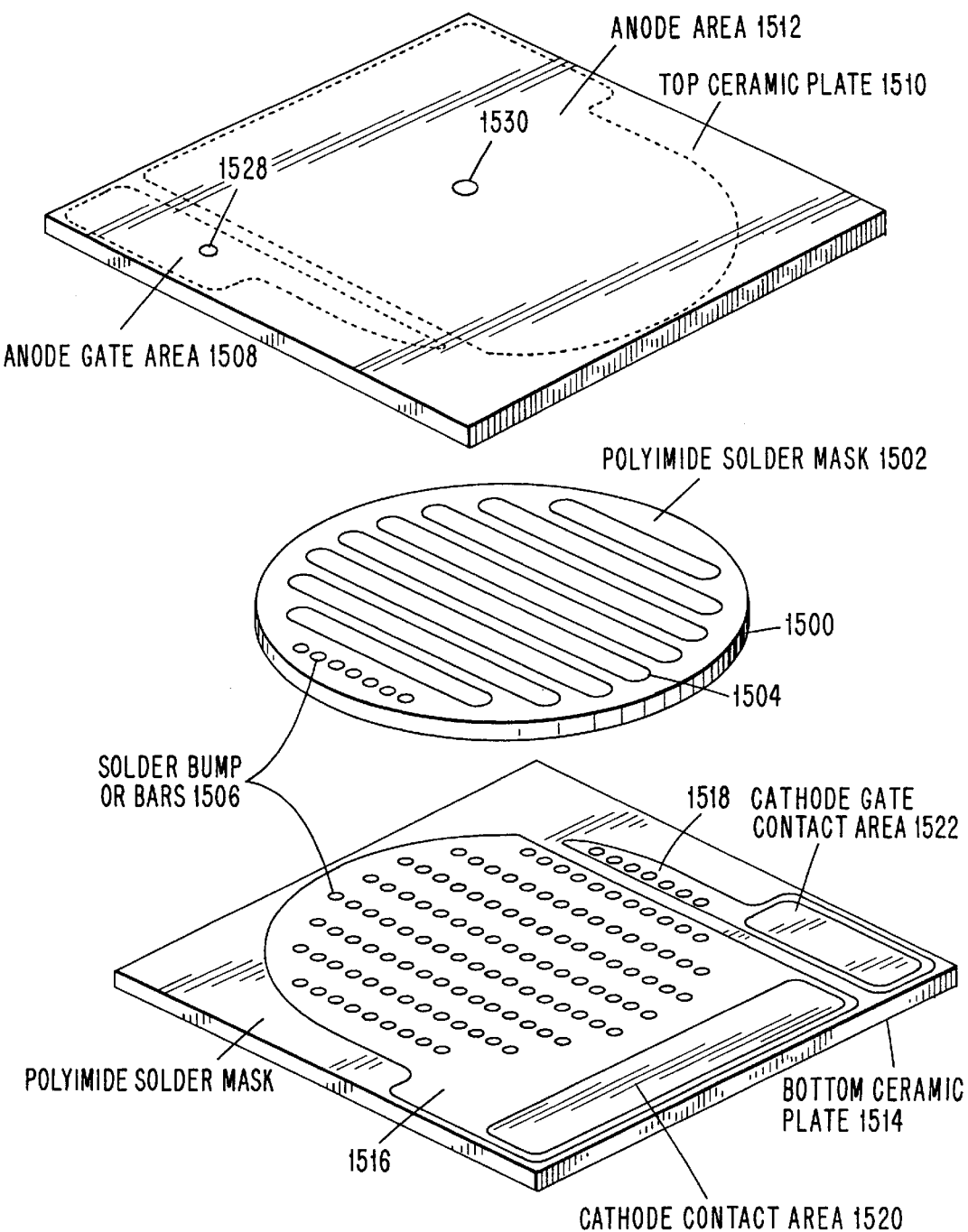
FIG. 15 illustrates an exemplary double-sided chip, solder bump packaging configuration for a four leaded device according to the present invention.

FIG. 15 illustrates exemplary packaging for a device processed on both sides, i.e., a four leaded DGTO. The wafer (Chip) 1500 is manufactured in accordance with the foregoing principles and includes an insulative surface layer 1502, which can, for example, be formed as a photodefinable polyimide or Pyralux solder mask. The insulative surface layer 1502 surrounds and separates the metallic emitter bars 1504 (only one of which is numbered in the figure for clarity). Also seen on the top surface of PPT wafer 1500 are a plurality of solder bumps or bars 1506. The solder bumps 1506 can, for example, be formed of an alloy which is 95% Pb and 5% Sn. Most of the solder bumps 1506 are disposed on the emitter bars 1504, although several (seven in this example) are provided outside of the emitter bars for gate contacts. These seven solder bumps are gate connection nodes which provide electrical connection to the anode gate area 1508 of the top ceramic plate 1510. Similarly, the solder bumps 1506 disposed within the emitter bars 1504 contact a mating anode area surface whose outline is seen on top plate 1510. Ceramic thru-holes 1528–1530 provide the necessary access to the direct band copper on the bottom of the top plate.

The patterning on the underside of top plate 1510 is essentially mirrored by that seen on the top side of the bottom ceramic plate 1514. The bottom plate, however, provides connections to the cathode and cathode gate whereas the top plate provides connections to the anode and anode gate. Thus, bottom plate 1514 includes a cathode area 1516 including a plurality of solder bumps 1506. The solder bumps 1506 intermesh with corresponding solder bumps on the underside of wafer 1500 (not shown) to provide electrical contact with the cathode. Like the emitter bars 1504 on the topside of wafer 1500, the solder bumps on the underside of wafer 1500 are aligned in rows. Analogously to anode gate area 1508, cathode gate area 1518 has solder bumps 1506 which intermesh with corresponding solder bumps on the underside of wafer 1500. Cathode contact area 1520 and cathode gate contact area 1522 are externally connected through leads (not shown) which extend upwardly toward top plate 1510. Metallized vias 1528 and 1530 provide external connection to the anode gate 1508 and anode 1512, respectively. This allows all four leads to emanate from the same side of the package even though both sides of the wafer are processed and contacted. Although the exemplary embodiment illustrated in FIG. 15 uses solder bumps (i.e., dot-like structures), those skilled in the art will appreciate that the bumps could also be elongated to be shaped as bars or to provide continuous coverage over the entire serpentine emitter.

Power electronic switching devices according to the foregoing exemplary embodiments and other embodiments not specifically discussed herein provide many advantages over conventional SCR technology. The following table summarizes exemplary differences between the conventional thyristor (hockey puck) and the inventive PPT.

| | Comparison of Conventional Thyristor with the Subject Device | |
| --- | --- | --- |
| FEATURE | CONVENTIONAL THYRISTOR (Hockey Puck) | SUBJECT DEVICE (DGTO, DMCT) |
| dI/dt | <200 A/µs | Unlimited (like transistor). |
| dv/dt | good due to internal shorts (<200 A/µs) | Integrated resistor will enable high dv/dt. |
| On State | Good for DC conditions, but worst for high Di/dt. | Good for fast turn-in -dV/dt, but at the cost of higher DC on-state voltage. Reverse triggering can be used to offset high DC on-state voltage. |
| Reverse Blocking | Symmetric blocking normally required. | Asymmetric blocking permitted thereby enabling more efficient forward drop. |
| Maximum Operating Junction Temperature | 125° C. maximum due to leakage current causing unwanted gate turn-on | Both emitter junctions can be effectively shorted, leading to diode like blocking performance at temperature >200° C. |
| Reverse Triggering | Not possible | In the inverse direction, the subject device can act as a forward biased diode and can be reverse triggered for complete turn-on prior to forward conduction for the lowest possible turn-on losses and highest operating current density. |
| Emitter Design | Massive area turned on by a plasma spreading from a point-like gate. | Distributed gate-emitter area turning on instantly along the gate-emitter length; similar to high speed transistors. The distributed gate emitter turn on can be achieved from both sides of both anode and cathode emitters thereby eliminating delay time for regeneration. |
| Bevel, Junction Termination | A negative forward blocking bevel (VBO) and a positive reverse blocking bevel (PRV). This compromise is required for symmetric blocking but only yields 80% of theoretical breakdown. | Positive forward blocking bevel achieves 100% of theoretical blocking voltage. |
| Metalization Design | Low current spring loaded gate, dry pressure emitter spring loaded. | A thick metal lead frame can be soldered to the entire length of both anode and cathode emitters. As an alternative, a thick metal film can be applied by thick film metallurgy or evaporation. High gate current for inner and outer gates allows high dI/dt. |
| Gate Location | The gate region is normally at the center of the chip surrounded by the emitter causing dI/dt problems. | The distributed emitter region is a central island surrounded by an inner and outer gate region. This design permits the gate to supply current on both sides of the serpentine emitter for high dI/dt. |

-continued

Comparison of Conventional Thyristor with the Subject Device

| FEATURE | CONVENTIONAL THYRISTOR (Hockey Puck) | SUBJECT DEVICE (DGTO, DMCT) |
|---|---|---|
| Product Limitations | SCR's above 2.5 kV are only available in large size hockey pucks because the typical 3° negative bevels require 0.6" of inactive bevel space. | The proposed devices will initially be available up to 8 kV in chip sizes from 8 mm dia to <100 mm and can be packaged in small T03 type packages, but with long strike and creep distance, thus filling a hole in the industry's offering. |
| Opening Switch Potential | The best GTO's have poor turn off gain (5), poor SOA, need large snubbers, and operate at typical BJT current densities at turn-off. The MCT's also have poor SOA performance. | The subject devices, e.g., a double sided GTO, can have both anode and cathode emitter shunts to enable diode like recovery for the best SOA known and could replace IGBT's, BJT's, GTO's and MCT's as a more cost effective switch. |

The above-described exemplary embodiments are intended to be illustrative in all respects, rather than restrictive, of the present invention. While it is apparent from the foregoing discussion that the output parameters of devices according to the present invention can vary based on various design considerations, exemplary output parameters include:

0.5" diameter die, $I_{RMS}$=70 A, $I_{PK}$=700 A, di/dt=10,000 A/μs 0.3" diameter die, $I_{RMS}$=25 A, $I_{PK}$=250 A, di/dt=1,500 A/μs FIG. 16 illustrates the diode-like turn off performance that can be obtained from the four leaded DGTO 1556 driving a series wound DC motor (represented by loads RL). During the ON state of the DGTO 1556, current flows through the main junction of DGTO 1556 along the solid arrow denoted "ON PATH". The split loads RL charge capacitors 1604 and 1606, respectively. Two discrete switches (e.g., FETs or IGBTs) 1600 and 1602 are used to control the anode and cathode gates, which are referred to herein as the high and low sides of the split load, respectively. When both switches are turned on, both emitters are reverse biased by the load voltage (stored on the capacitors 1604 and 1606). That is, a biasing current flows in the directions indicated by the "OFF" arrows. The current through the DGTO 1556 is diverted away from both back biased emitters, i.e., along the "ON-OFF TRANSITION PATH", through the two switches and back to supply 1608 for a diode-like turn off recovery. The four leaded device enables both gates to be referred to the high/low side of the load thereby back biasing both emitters. Those skilled in the art will appreciate that this is not possible with MCT type devices, which can only zero bias one of the two emitters and must depend on open base recovery, internal recombination and lifetime control for turn off. The MCT does not let the source be referenced to a low side. As a result, the four leaded DGTO has the potential for high controllable current ratings and to turn-off like a PIN diode which has the best RBSOA known.

For high voltage applications (e.g., greater than 3 kV), IGBTs rather than DMOS FETs can be used as pilot switches (e.g., switch S of FIG. 9) for turn-on of both emitters which is a major advantage over the current thyristors. Simultaneous turn-on of both anode and cathode emitters, as shown in FIG. 9, has the following advantages:

Instant latch-on over the entire emitter without delay or di/dt failure.

The pilot switch S (FIG. 9) can be a small inexpensive IGBT (@$1–2) or SCR or opto device to control a>1000 A, >6 kV device.

The fastest possible turn-in di/dt and turn off for >20 kHz switching vs. the 2 kHz limit for the current state of the art IGBT.

Unlimited di/dt performance.

The highest turn-on gain, that is a few microwatt seconds of photon or electrical energy can trigger a >6 kV DGTO on to >1,000 A in less than 100 ns. That is, only mircro watts of power are needed to latch on >6 mega watt control devices.

Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A method for doping a semiconductor material to become a p-type doped semiconductor material comprising the steps of:

(a) doping said semiconductor material with aluminum by diffusing said aluminum into said semiconductor material for about 16 hours at about 1275 degrees Celsius;

(b) doping said semiconductor material with gallium; and (c) doping said semiconductor material with boron.

2. A method for doping a semiconductor material to become a p-type doped semiconductor material comprising the steps of:

(a) doping said semiconductor material with aluminum;

(b doping said semiconductor material with gallium; and (c) doping said semiconductor material with boron, wherein at least one of said doping steps is performed using a variable frequency traveling wave tube.

3. The method of claim 2, wherein said step of doping said semiconductor material with aluminum further comprises the step of:

diffusing said aluminum into said semiconductor material for about 16 hours at about 1275 degrees Celsius.

4. A method of manufacturing a semiconductor device comprising the steps of:

(a) doping a substrate to obtain a multi-layer semiconductor structure;

(b) providing an emitter mask over an area of an n+ layer of said semiconductor structure;

(c) selectively etching a remaining portion of said n+ layer to expose said emitter area;

(d) polyetching said semiconductor structure to remove remaining n material; and (e) removing said emitter mask.

5. The method of claim 4, wherein said step of doping a substrate further comprises the steps of:

doping said substrate with aluminum;

doping said substrate with gallium; and doping said substrate with boron.

6. The method of claim 4, wherein said step of selectively etching further comprises the step of:

using an etch having a first etch rate for etching n-doped semiconductor material and a second etch rate for etching p-doped semiconductor material, said first rate being greater than said second rate.

7. The method of claim 4, further comprising the step of:
repeating steps (a)–(e) to another side of said substrate.

8. The method of claim 4, wherein said multi-layer semiconductor structure has four layers, and further comprising the step of:
providing a contact to each of said four layers.

9. A method for doping a semiconductor material to become a p-type doped material comprising the steps of:
(a) initially doping said semiconductor material with aluminum;
(b) next, doping said semiconductor material with gallium; and
(c) then, doping said semiconductor material with boron.

10. A method of manufacturing a semiconductor device comprising the steps of:
(a) doping a substrate to obtain a multi-layer semiconductor structure;
(b) masking and etching both sides of said multi-layer semiconductor structure; and
(c) providing electrical contacts to both sides of said multi-layer semiconductor structure.

11. The method of claim 10, wherein said contacts include an anode contact and an anode gate contact on one side of said multilayer semiconductor structure and a cathode contact and a cathode gate contact on another side of said multi-layer semiconductor structure.

* * * * *